United States Patent
Goto

(10) Patent No.: US 11,545,960 B2
(45) Date of Patent: Jan. 3, 2023

(54) MULTI-MODE SURFACE ACOUSTIC WAVE FILTER WITH SLANTED ACOUSTIC REFLECTORS

(71) Applicant: Skyworks Solutions, Inc., Irvine, CA (US)

(72) Inventor: Rei Goto, Osaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 287 days.

(21) Appl. No.: 16/681,462

(22) Filed: Nov. 12, 2019

(65) Prior Publication Data

US 2020/0162054 A1 May 21, 2020

Related U.S. Application Data

(60) Provisional application No. 62/768,674, filed on Nov. 16, 2018.

(51) Int. Cl.
*H03H 9/25* (2006.01)
*H03H 9/64* (2006.01)

(52) U.S. Cl.
CPC .............. *H03H 9/25* (2013.01); *H03H 9/643* (2013.01); *H03H 9/645* (2013.01); *H03H 9/6463* (2013.01); *H03H 9/6469* (2013.01)

(58) Field of Classification Search
CPC ........... H03H 9/02574; H03H 9/02685; H03H 9/02692; H03H 9/02708; H03H 9/02716; H03H 9/02748; H03H 9/02834; H03H 9/02842; H03H 9/14541; H03H 9/25; H03H 9/643; H03H 9/6436; H03H 9/645; H03H 9/6463; H03H 9/6469; H03H 9/6476; H03H 9/6496
USPC ...................................... 333/195; 310/313 D
See application file for complete search history.

(56) References Cited

U.S. PATENT DOCUMENTS

| 5,406,159 | A | 4/1995 | Wright | |
|---|---|---|---|---|
| 6,650,207 | B1 | 11/2003 | Tanaka | |
| 6,842,091 | B2 | 1/2005 | Yip | |
| 6,894,588 | B2 * | 5/2005 | Detlefsen | ............. H03H 9/6436 |
| | | | | 310/313 D |
| 7,015,776 | B2 | 3/2006 | Takamine | |

(Continued)

FOREIGN PATENT DOCUMENTS

| JP | 59-200519 | | 11/1984 |
|---|---|---|---|
| JP | 61-004316 | A * | 1/1986 |

(Continued)

OTHER PUBLICATIONS

English language machine translation of JP 2010-010874, published Jan. 14, 2010, 16 pages. (Year: 2010).*
Hashimoto et al., "Operation mechanism of double-mode surface acoustic wave filters with pitch-modulated IDTs and reflectors", IEEE Transactions on Ultrasonics, Ferroelectrics, and Frequency Control, vol. 54(10):2157-2161 (2007).
Kawachi et al., "A low-loss and wide-band DMS filter using pitch-modulated IDT and reflector structures", IEEE Ultrasonics Symposium, pp. 298-301 (2004).

(Continued)

*Primary Examiner* — Hafizur Rahman
(74) *Attorney, Agent, or Firm* — Knobbe, Martens, Olson & Bear, LLP

(57) ABSTRACT

Multi-mode surface acoustic wave filters are disclosed. A multi-mode surface acoustic wave filter can include a plurality of interdigital transducer electrodes that are longitudinally coupled to each other and slanted acoustic reflectors on opposing sides of the plurality of interdigital transducer electrodes. The acoustic reflectors include acoustic reflector fingers with slanted pitches.

20 Claims, 19 Drawing Sheets

(56) References Cited

U.S. PATENT DOCUMENTS

| | | | |
|---|---|---|---|
| 7,453,335 B2 * | 11/2008 | Funami | H03H 9/725 |
| | | | 333/195 |
| 7,777,625 B1 | 8/2010 | Puccio et al. | |
| 8,049,583 B2 | 11/2011 | Ohkubo et al. | |
| 8,253,302 B2 | 8/2012 | Arakawa et al. | |
| 8,669,832 B2 | 3/2014 | Kamiguchi et al. | |
| 9,019,040 B2 | 4/2015 | Takamine | |
| 9,825,612 B2 * | 11/2017 | Kawachi | H03H 9/706 |
| 10,284,176 B1 | 5/2019 | Solal | |
| 2003/0169129 A1 | 9/2003 | Takamine | |
| 2004/0207491 A1 | 10/2004 | Nakaya et al. | |
| 2012/0195207 A1 | 8/2012 | Mueck et al. | |
| 2014/0167881 A1 | 6/2014 | Iwasaki et al. | |
| 2014/0285287 A1 | 9/2014 | Komatsu et al. | |
| 2015/0288346 A1 * | 10/2015 | Nakamura | H01L 41/047 |
| | | | 333/133 |
| 2017/0099043 A1 | 4/2017 | Goto et al. | |
| 2018/0138893 A1 | 5/2018 | Caron | |
| 2019/0288668 A1 | 9/2019 | Takahashi et al. | |
| 2020/0162055 A1 * | 5/2020 | Goto | H03H 9/02692 |
| 2020/0162056 A1 * | 5/2020 | Goto | H03H 9/645 |

FOREIGN PATENT DOCUMENTS

| | | | |
|---|---|---|---|
| JP | 2000-196399 | | 7/2000 |
| JP | 2001-298346 | | 10/2001 |
| JP | 2007-013459 | | 1/2007 |
| JP | 2010-010874 A | * | 1/2010 |
| JP | 2010-252359 | | 11/2010 |
| WO | WO 2018/088118 | | 5/2018 |

OTHER PUBLICATIONS

Meltaus et al., "Low-loss, multimode 5-IDT SAW filter", IEEE Transactions on Ultrasonics, Ferroelectrics, and Frequency Control, vol. 52(6):1013-1019 (2005).

Tagawa et al., "Multi-stage design of DMS filters with free & freeze method", Proceedings of the 6th WSEAS International Conference on Applied Computer Science, Spain, Dec. 16-18, 2006:508-513.

* cited by examiner

MULTI-MODE SURFACE ACOUSTIC WAVE FILTER WITH SLANTED ACOUSTIC REFLECTORS

CROSS REFERENCE TO PRIORITY APPLICATION

This application claims the benefit of priority of U.S. Provisional Patent Application No. 62/768,674, filed Nov. 16, 2018 and titled "DOUBLE MODE SURFACE ACOUSTIC WAVE FILTER," the disclosure of which is hereby incorporated by reference in its entirety herein.

BACKGROUND

Technical Field

Embodiments of this disclosure relate to acoustic wave filters and, more specifically, to multi-mode surface acoustic wave filters.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of acoustic wave resonators arranged to filter a radio frequency signal. Example acoustic wave filters include surface acoustic wave (SAW) filters and bulk acoustic wave (BAW) filters. A SAW resonator of a SAW filter typically includes an interdigital transductor electrode on a piezoelectric substrate. A SAW resonator is arranged to generate a surface acoustic wave. SAW filters include multi-mode SAW filters, such as double mode SAW (DMS) filters.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a multi-mode surface acoustic wave filter that includes a plurality of interdigital transducer electrodes and acoustic reflectors on opposing sides of the plurality of interdigital transducer electrodes. The plurality of interdigital transducer electrodes include a first interdigital transducer electrode and a second interdigital transducer electrode. The first interdigital transducer electrode is longitudinally coupled to the second interdigital transducer electrode. The acoustic reflectors include acoustic reflector fingers arranged to suppress a spurious response due to shear horizontal mode of the multi-mode surface acoustic wave filter. The multi-mode surface acoustic wave filter is configured to filter a radio frequency signal.

The acoustic reflector fingers can have stepped reflector lengths. Pitches of the acoustic reflector fingers can be modulated. The acoustic reflectors on opposing sides of the interdigital transducer electrodes can have different pitches than each other. There can be metal fill in an area where the acoustic reflector fingers have stepped lengths.

The acoustic reflector fingers can have slanted pitches. The slanted pitches can include different spacings between different respective portions of adjacent acoustic reflector fingers of the acoustic reflectors.

The multi-mode surface acoustic wave filter can further include a plurality of second interdigital transducer electrodes arranged in parallel with the plurality of interdigital transducer electrodes, and second acoustic reflectors on opposing sides of the second interdigital transducer electrodes.

The acoustic reflectors can be symmetric about an aperture direction.

The acoustic reflector fingers can have slanted pitches and stepped lengths.

The multi-mode surface acoustic wave filter can further include a temperature compensation layer and a piezoelectric layer, in which the temperature compensation layer is positioned over the plurality of interdigital transducer electrodes and the piezoelectric layer. The temperature compensation layer can be a silicon dioxide layer.

The multi-mode surface acoustic wave filter can further include a support substrate and a piezoelectric layer on the support substrate, in which the plurality of interdigital transducer electrodes are on and in physical contact with the piezoelectric layer.

The first interdigital transducer electrode can include two metal layers.

Another aspect of this disclosure is a method of filtering a radio frequency signal with a multi-mode surface acoustic wave filter. The method includes: providing a radio frequency signal to the multi-mode surface acoustic wave filter; filtering the radio frequency signal with the multi-mode surface acoustic wave filter, the multi-mode surface acoustic wave filter including a plurality of longitudinally coupled interdigital transducer electrodes and acoustic reflectors on opposing sides of the plurality of longitudinally coupled interdigital transducer electrodes; and during the filtering, suppressing a spurious response due to shear horizontal mode of the multi-mode surface acoustic wave filter with the acoustic reflectors of the multi-mode surface acoustic wave filter.

The acoustic reflectors can each include acoustic reflector fingers with stepped lengths. Alternatively or additionally, the acoustic reflectors can each include acoustic reflector fingers with slanted pitches.

Another aspect of this disclosure is a packaged module that includes a packaging substrate, a radio frequency switch on the packaging substrate, and a multi-mode surface acoustic wave filter on the packaging substrate. The multi-mode surface acoustic wave filter is configured to filter a radio frequency signal provided by the radio frequency switch. The multi-mode surface acoustic wave filter includes a plurality of longitudinally coupled interdigital transducer electrodes and acoustic reflectors on opposing sides of the plurality of longitudinally coupled interdigital transducer electrodes. The acoustic reflectors include acoustic reflector fingers arranged to suppress a spurious response due to shear horizontal mode of the multi-mode surface acoustic wave filter.

The multi-mode surface acoustic wave filter can be included in a filter coupled to the radio frequency switch. The filter can include a plurality of acoustic wave resonators coupled to the multi-mode surface acoustic wave filter.

The packaged module can further include a radio frequency amplifier on the packaging substrate, in which the radio frequency amplifier is coupled to the multi-mode surface acoustic wave filter.

Another aspect of this disclosure is a multi-mode surface acoustic wave filter that includes a plurality of interdigital transducer electrodes and acoustic reflectors on opposing sides of the plurality of interdigital transducer electrodes. The plurality of interdigital transducer electrodes include a first interdigital transducer electrode and a second interdigital transducer electrode. The first interdigital transducer electrode is longitudinally coupled to the second interdigital transducer electrode. The acoustic reflectors include acoustic reflector fingers with slanted pitches. The multi-mode surface acoustic wave filter is configured to filter a radio frequency signal.

The slanted pitches can include different spacings between different respective portions of adjacent acoustic reflector fingers of the acoustic reflectors.

The acoustic reflector fingers can have stepped lengths.

The multi-mode surface acoustic wave filter can further include a temperature compensation layer and a piezoelectric layer, in which the temperature compensation layer is positioned over the plurality of interdigital transducer electrodes and the piezoelectric layer. The temperature compensation layer can be a silicon dioxide layer.

The multi-mode surface acoustic wave filter can further include a support substrate and a piezoelectric layer on the support substrate, in which the plurality of interdigital transducer electrodes are on and in physical contact with the piezoelectric layer.

The first interdigital transducer electrode can include two metal layers.

The plurality of interdigital transducer electrodes can include a third interdigital transducer electrode that is longitudinally coupled to the second interdigital transducer electrode.

Another aspect of this disclosure is a method of filtering a radio frequency signal with a multi-mode surface acoustic wave filter. The method includes providing a radio frequency signal to the multi-mode surface acoustic wave filter; filtering the radio frequency signal with the multi-mode surface acoustic wave filter, the multi-mode surface acoustic wave filter including a plurality of longitudinally coupled interdigital transducer electrodes and acoustic reflectors on opposing sides of the plurality of longitudinally coupled interdigital transducer electrodes, the acoustic reflectors including acoustic reflector fingers with slanted pitches; and during the filtering, suppressing a spurious response due to shear horizontal mode of the multi-mode surface acoustic wave filter with the acoustic reflectors of the multi-mode surface acoustic wave filter.

The method can further include providing temperature compensation during the filtering with a temperature compensation layer of the multi-mode surface acoustic wave filter. The temperature compensation layer can be positioned over the plurality of longitudinally coupled interdigital transducer electrodes and a piezoelectric layer on which the plurality of interdigital transducer electrodes are positioned.

The slanted pitches can include different spacings between different respective portions of adjacent acoustic reflector fingers of the acoustic reflectors.

The multi-mode surface acoustic wave filter can further include a support substrate and a piezoelectric layer over the support substrate, in which the plurality of longitudinally coupled interdigital transducer electrodes are over and in physical contact with the piezoelectric layer.

The method can be performed in a mobile wireless communication device.

The multi-mode surface acoustic wave filter can be included in a receive filter.

Another aspect of this disclosure is a packaged module that includes a multi-mode surface acoustic wave filter on a packaging substrate, and other circuitry on the packaging substrate and in communication with the multi-mode surface acoustic wave filter. The multi-mode surface acoustic wave filter is configured to filter a radio frequency signal. The multi-mode surface acoustic wave filter includes a plurality of longitudinally coupled interdigital transducer electrodes and acoustic reflectors on opposing sides of the plurality of longitudinally coupled interdigital transducer electrodes. The acoustic reflectors include acoustic reflector fingers with slanted pitches.

The other circuitry can include a radio frequency amplifier. Alternatively or additionally, the other circuitry can include a radio frequency switch.

The multi-mode surface acoustic wave filter can be included in a receive filter of a multiplexer.

The slanted pitches can include different spacings between different respective portions of adjacent acoustic reflector fingers of the acoustic reflectors.

The multi-mode surface acoustic wave filter can further include a temperature compensation layer and a piezoelectric layer, in which the temperature compensation layer is positioned over the plurality of interdigital transducer electrodes and the piezoelectric layer.

Another aspect of this disclosure is a multi-mode surface acoustic wave filter that includes a plurality of interdigital transducer electrodes and acoustic reflectors on opposing sides of the plurality of interdigital transducer electrodes. The plurality of interdigital transducer electrodes include a first interdigital transducer electrode and a second interdigital transducer electrode. The first interdigital transducer electrode is longitudinally coupled to the second interdigital transducer electrode. The acoustic reflectors include acoustic reflector fingers with stepped lengths. The multi-mode surface acoustic wave filter is configured to filter a radio frequency signal.

The acoustic reflectors can be symmetric about an aperture direction.

Pitches of the acoustic reflector fingers can be modulated.

The acoustic reflectors on opposing sides of the interdigital transducer electrodes can have different pitches than each other.

The multi-mode surface acoustic wave filter can further include a plurality of second interdigital transducer electrodes arranged in parallel with the plurality of interdigital transducer electrodes, and second acoustic reflectors on opposing sides of the plurality of second interdigital transducer electrodes. The second acoustic reflectors can include second reflector fingers having a second stepped lengths that are different than the stepped lengths of the acoustic reflector fingers.

The multi-mode surface acoustic wave filter can include metal fill in an area where the acoustic reflector fingers have stepped lengths.

The multi-mode surface acoustic wave filter can include a temperature compensation layer and a piezoelectric layer, in which the temperature compensation layer being positioned over the plurality of interdigital transducer electrodes and the piezoelectric layer. The temperature compensation layer can be a silicon dioxide layer.

The multi-mode surface acoustic wave filter can include a support substrate and a piezoelectric layer on the support substrate, in which the plurality of interdigital transducer electrodes are on and in physical contact with the piezoelectric layer.

The interdigital transducer electrodes can include two metal layers.

Another aspect of this disclosure is a method of filtering a radio frequency signal with a multi-mode surface acoustic wave filter. The method includes providing a radio frequency signal to the multi-mode surface acoustic wave filter; filtering the radio frequency signal with the multi-mode surface acoustic wave filter that includes interdigital transducer electrodes and acoustic reflectors on opposing sides of the interdigital transducer electrodes, the acoustic reflectors including acoustic reflector fingers with stepped lengths; and during the filtering, suppressing a spurious response due to shear horizontal mode of the multi-mode surface acoustic wave filter with the acoustic reflectors of the multi-mode surface acoustic wave filter.

The method can further include providing temperature compensation during the filtering with a temperature compensation layer of the multi-mode surface acoustic wave filter, in which the temperature compensation layer is positioned over the plurality of longitudinally coupled interdigital transducer electrodes and a piezoelectric layer on which the plurality of longitudinally coupled interdigital transducer electrodes are positioned.

The acoustic reflectors can have slanted pitches.

The multi-mode surface acoustic wave filter can be included in a receive filter of a multiplexer.

Another aspect of this disclosure is a wireless communication device that includes a radio frequency front end and an antenna in communication with the radio frequency front end. The radio frequency front end includes a multi-mode surface acoustic wave filter configured to filter a radio frequency signal. The multi-mode surface acoustic wave filter includes interdigital transducer electrode and acoustic reflectors on opposing sides of the interdigital transducer electrodes. The acoustic reflectors include acoustic reflector fingers having stepped lengths.

The wireless communication device can be a mobile phone.

The wireless communication device can further include a transceiver in communication with the radio frequency front end, and a baseband processor in communication with the transceiver.

The multi-mode surface acoustic wave filter can be included in a diversity receive path of the radio frequency front end.

The multi-mode surface acoustic wave filter can be included in a receive filter of a multiplexer.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 16/681,518, titled "MULTI-MODE SURFACE ACOUSTIC WAVE FILTER," filed on even date herewith, the entire disclosure of which is hereby incorporated by reference herein. The present disclosure relates to U.S. patent application Ser. No. 16/681,522, titled "MULTI-MODE SURFACE ACOUSTIC WAVE FILTER WITH STEPPED ACOUSTIC REFLECTORS," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 1A includes a zoomed in illustration of the acoustic reflector pitch.

FIG. 1D includes a zoomed in illustration of the acoustic reflector pitch.

DETAILED DESCRIPTION OF CERTAIN EMBODIMENTS

Figure 1A:
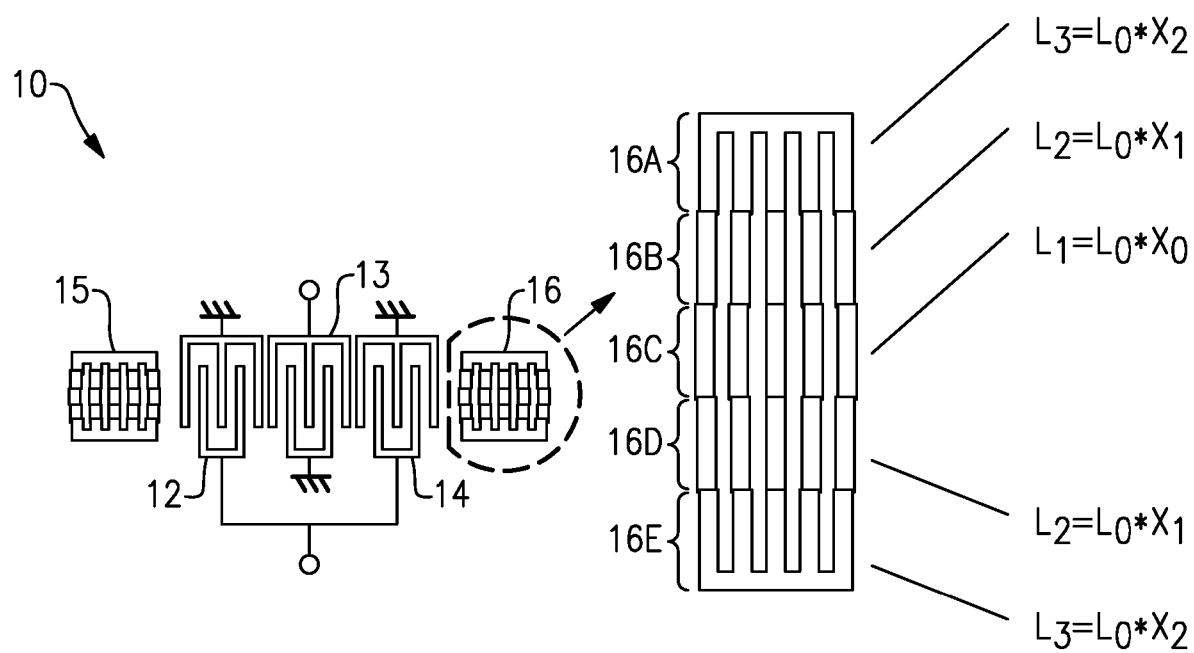
FIG. 1A is a schematic diagram of a multi-mode surface acoustic wave (MMS) filter with a slanted acoustic reflector pitch according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. A multi-mode surface acoustic wave (MMS) filter is a type of an acoustic wave filter. MMS filters include a plurality of interdigital transducer (IDT) electrodes that are longitudinally coupled to each other and positioned between acoustic reflectors. Some MMS filters are referred to as double mode surface acoustic wave (DMS) filters. There may be more than two modes of such DMS filters and/or for other MMS filters. MMS filters can have a relatively wide passband due to a combination of various resonant modes. MMS filters can have a balanced (differential) input and/or a balanced output with proper arrangement of IDTs. MMS filters can achieve a relatively low loss and a relatively good out of band rejection. In certain applications, MMS filters can be receive filters arranged to filter radio frequency signals received by an antenna. MMS filters can be included in a receive filter that also includes a plurality of acoustic resonators arranged in a ladder topology. MMS filters can be temperature compensated by including a temperature compensation layer, such as a silicon dioxide ($SiO_2$) layer, over IDT electrodes. Such a temperature compensation layer can cause a temperature coefficient of frequency (TCF) of an MMS filter to be closer to zero. In some instances, an MMS filter can include a multi-layer piezoelectric substrate.

A spurious response due to shear horizontal (SH) mode can cause insertion loss degradation in an MMS filter. The spurious response due to SH mode can also be referred to as a SH mode spurious or a SH mode spurious response. In a temperature compensated surface acoustic wave (TC-SAW) filter with a silicon dioxide/IDT/lithium niobate structure, SH spurious strength can be strongly affected by one or more of the lithium niobate ($LiNbO_3$) crystal cut angle, over coat silicon dioxide thickness, IDT thickness, or duty factor. Designing such an MMS filter to suppress SH mode spurious can be difficult.

Aspects of this disclosure relate to MMS filters that include acoustic reflectors arranged to suppress a SH mode spurious. In such MMS filters, a spurious response due to SH mode can be reduced without other electrical performance degradation by using the stepped acoustic reflector finger lengths and/or slanted acoustic reflector pitch. SH spurious frequency position can be spread by varying the acoustic reflector finger length and/or pitch in the MMS filter to thereby suppress a SH mode spurious response in the frequency response of the MMS filter.

FIG. 1A is a schematic diagram of a multi-mode surface acoustic wave (MMS) filter 10 with a slanted acoustic reflector pitch according to an embodiment. As illustrated, the MMS filter 10 includes interdigital transducer (IDT) electrodes 12, 13, and 14 and slanted acoustic reflectors 15 and 16. Each of the IDT electrodes 12, 14, and 13 includes bus bars and IDT fingers extending from a respective bus bar. The IDT electrodes 12, 13, and 14 are longitudinally coupled to each other. Adjacent IDT electrode fingers of different IDT electrodes can accomplish this coupling. For example, an IDT finger of the IDT electrode 12 that is closest to the IDT electrode 13 is longitudinally coupled to an IDT finger of the IDT electrode 13 that is closest to the IDT electrode 12. As another example, an IDT finger of the IDT electrode 13 that is closest to the IDT electrode 14 is longitudinally coupled to an IDT finger of the IDT electrode 14 that is closest to the IDT electrode 13. Although embodiments disclosed herein may include 3 longitudinally coupled IDT electrodes, any suitable principles and advantages disclosed herein can be applied to an MMS with any suitable number of longitudinally coupled IDT electrodes. As one example, any suitable combination of the acoustic reflectors disclosed herein can be implemented in an MMS filter with 5 longitudinally coupled IDT electrodes.

The slanted acoustic reflectors 15 and 16 are on opposing sides of the plurality of longitudinally coupled IDTs 12, 13, and 14 in plan view. The slanted acoustic reflectors 15 and 16 are arranged to suppress a SH mode spurious. The slanted acoustic reflectors 15 and 16 each include bus bars and acoustic reflector fingers. The acoustic reflector fingers are arranged to suppress a spurious response due to SH mode of the MMS filter 10. As illustrated in FIG. 1A, the acoustic reflector fingers have different portions with different respective pitches.

FIG. 1A also includes a zoomed in illustration of the slanted acoustic reflector 16 of FIG. 1A. The slanted acoustic reflector 16 includes acoustic reflector portions 16A, 16B, 16C, 16D, and 16F. As illustrated in FIG. 1A, the acoustic reflector portion 16C has a pitch of $L_1=L_0*X_0$, the acoustic reflector portions 16B and 16D have a pitch of $L_2=L_0*X_1$, and the acoustic reflector portions 16A and 16E have a pitch $L_3=L_0*X_2$. As one example, $L_0$ can be 2.06 um, $X_0$ can be 0.9995, $X_1$ can be 1.0000, and $X_2$ can be 1.0005. The acoustic reflector 15 can be similar to the acoustic reflector 16.

Figure 1B:
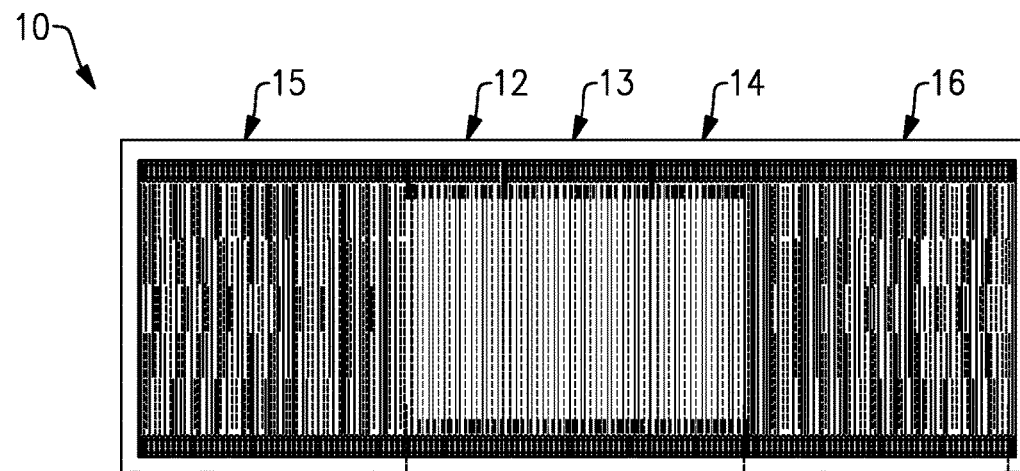
FIG. 1B is a layout diagram of the MMS filter of FIG. 1A.
Figure 1C:
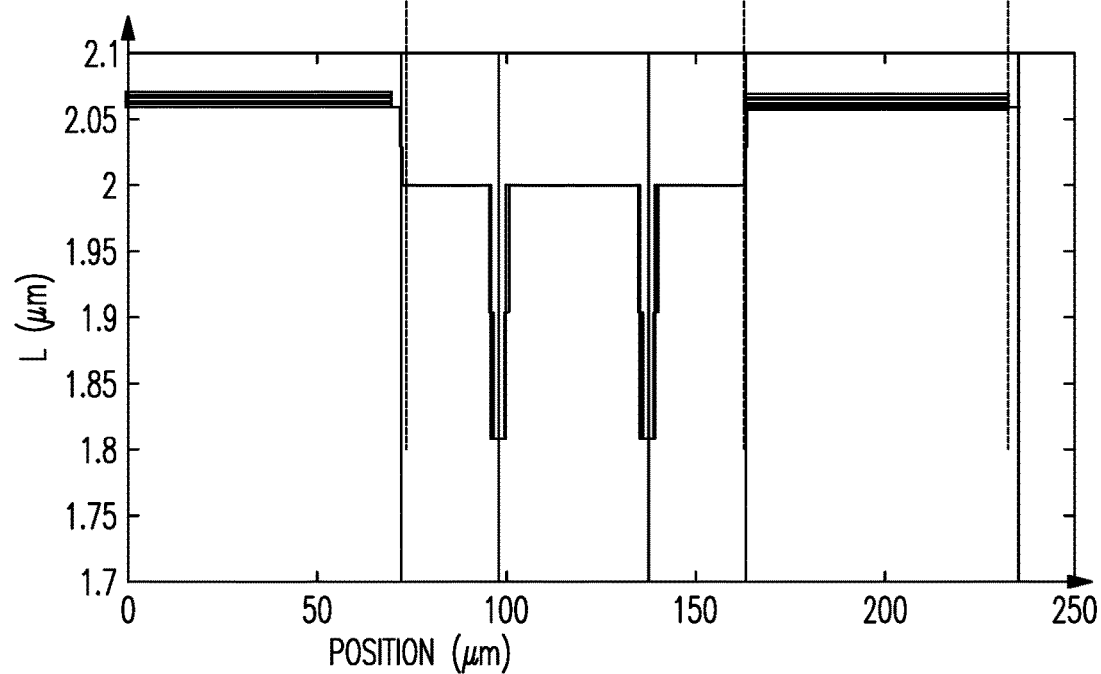
FIG. 1C is plot of pitch versus position for the layout of FIG. 1B.

FIG. 1B is a layout diagram of the MMS filter 10 of FIG. 1A. FIG. 1C is plot pitch versus position for the layout of FIG. 1B. These figures illustrate that the acoustic reflector pitch can have different pitches for different portions of the slanted acoustic reflectors 15 and 16. FIGS. 1B and 1C also illustrate that the pitches of the IDT electrodes 12, 13, and 14 can be smaller than pitches of each of the different portions of the acoustic reflectors 15 and 16.

Figure 1D:
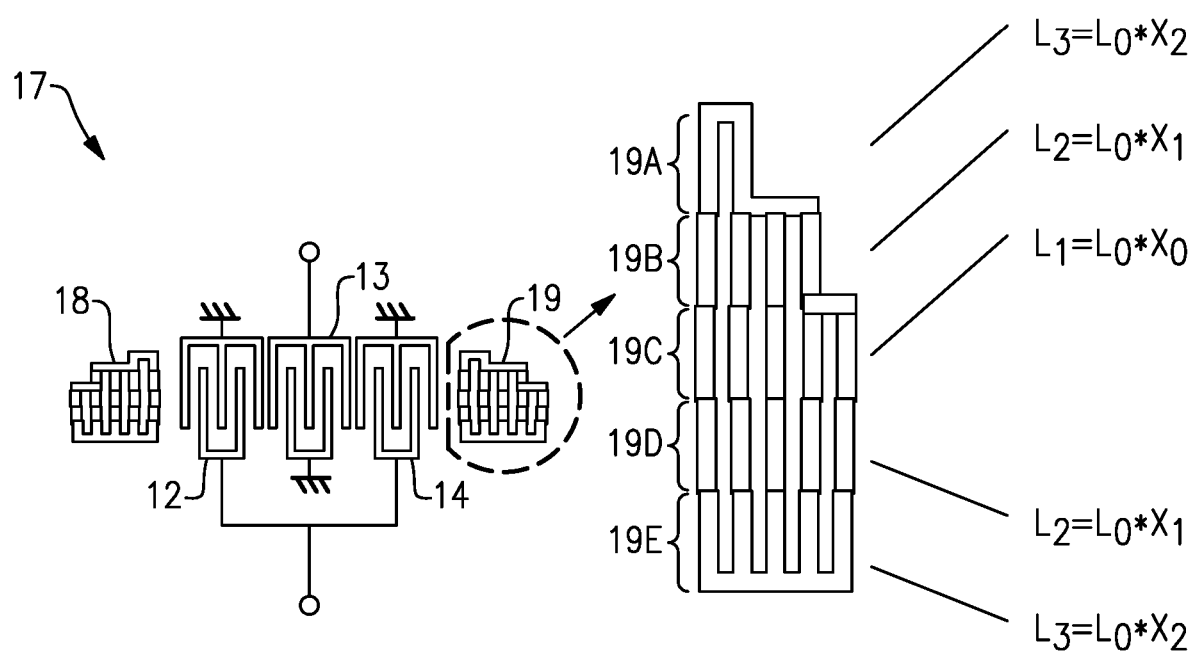
FIG. 1D is a schematic diagram of an MMS filter with a slanted acoustic reflector pitch and stepped reflector finger lengths according to an embodiment.

FIG. 1D is a schematic diagram of an MMS filter 17 with a slanted acoustic reflector pitch and stepped reflector finger lengths according to an embodiment. FIG. 1D includes a zoomed in illustration of the acoustic reflector pitch. The MMS filter 17 is similar to the MMS filter 10 of FIG. 1A, except that the MMS filter 17 includes different acoustic reflectors than the MMS filter 10. The MMS filter includes acoustic reflectors 18 and 19. The acoustic reflector 18 and 19 have slanted pitches and stepped acoustic reflector finger lengths. The acoustic reflectors 18 and 19 are arranged to suppress a SH mode spurious. As illustrated in FIG. 1D, the acoustic reflector 18 has acoustic reflector fingers of different lengths and also different portions of the reflectors fingers have different respective pitches. Similarly, the acoustic reflector 19 has acoustic reflector fingers of different lengths and also different portions of the reflectors fingers have different respective pitches.

FIG. 1D also includes a zoomed in illustration of the acoustic reflector 19 of FIG. 1D. The acoustic reflector 19 includes acoustic reflector portions 19A, 19B, 19C, 19D, and 19F. As illustrated in FIG. 1D, the acoustic reflector portion 19C has a pitch of $L_1=L_0*X_0$, the acoustic reflector portions 19B and 19D have a pitch of $L_2=L_0*X_1$, and the acoustic reflector portions 19A and 19E have a pitch $L_3=L_0*X_2$. As one example, $L_0$ can be 2.06 um, $X_0$ can be 0.9995, $X_1$ can be 1.0000, and $X_2$ can be 1.0005. The acoustic reflector 18 can be similar to the acoustic reflector 19.

Figure 2:
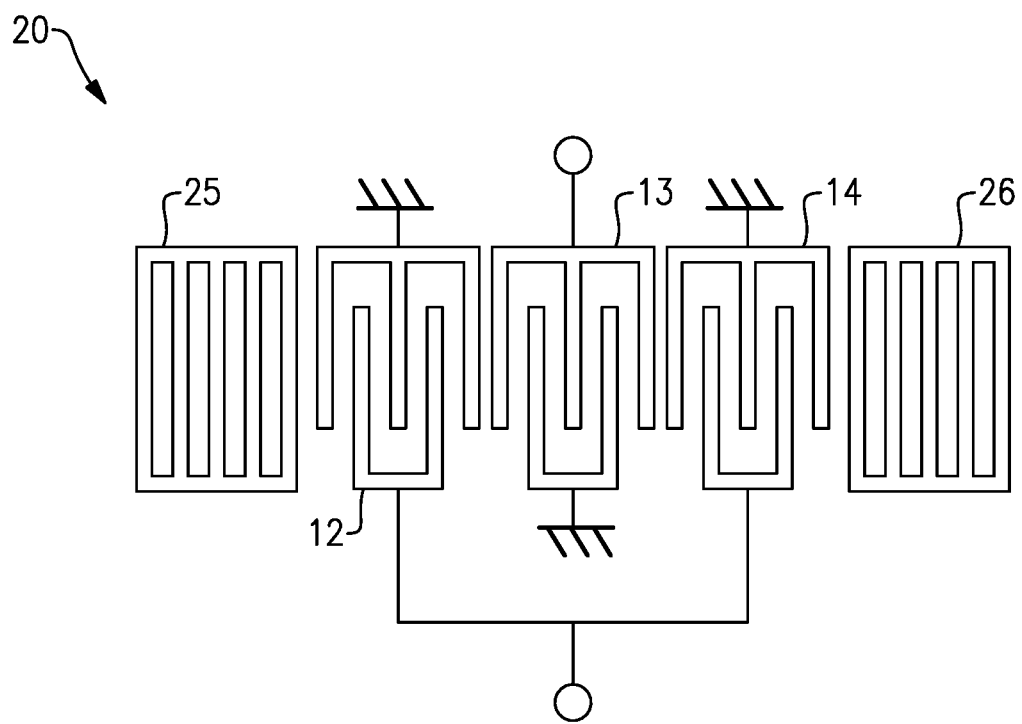
FIG. 2 is a schematic diagram of baseline MMS filter.

FIG. 2 is a schematic diagram of baseline MMS filter 20. The MMS filter 20 includes IDT electrodes 12, 13, and 14 and acoustic reflectors 25 and 26. The acoustic reflectors 25 and 26 each include two substantially parallel bus bars and acoustic reflector fingers having substantially uniform pitch and extending between the bus bars.

Figure 3A:
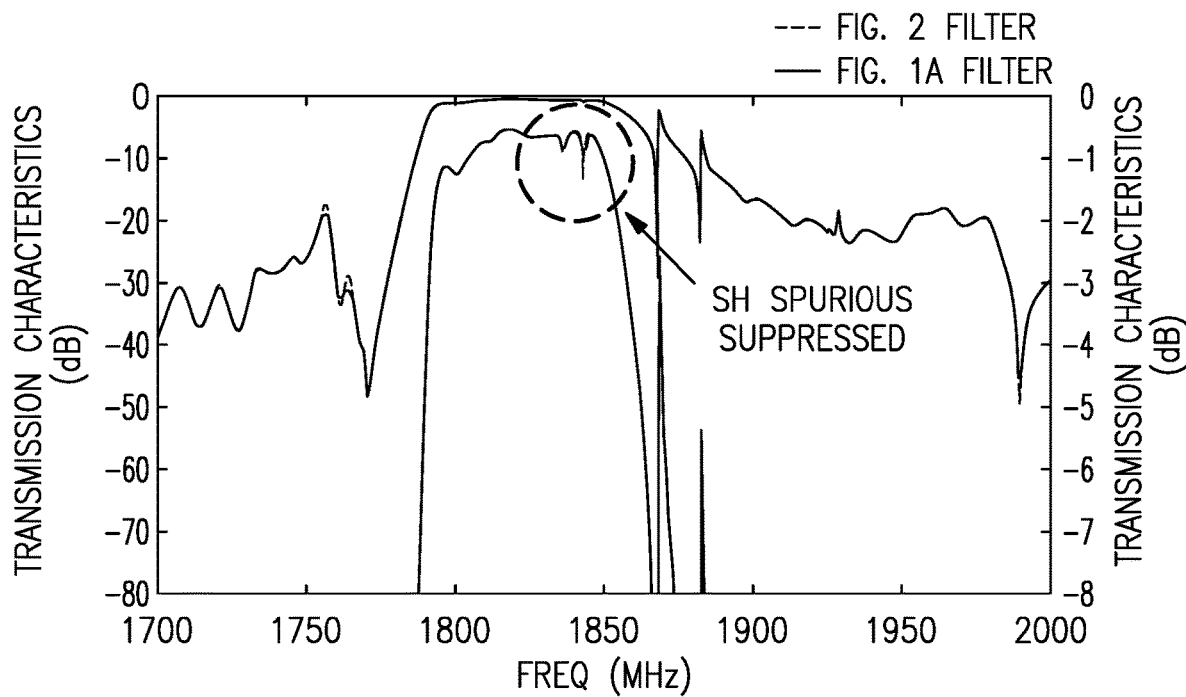
FIG. 3A is graph comparing transmission characteristics over frequency for the MMS filter of FIG. 1A and the MMS filter of FIG. 2.
Figure 3B:
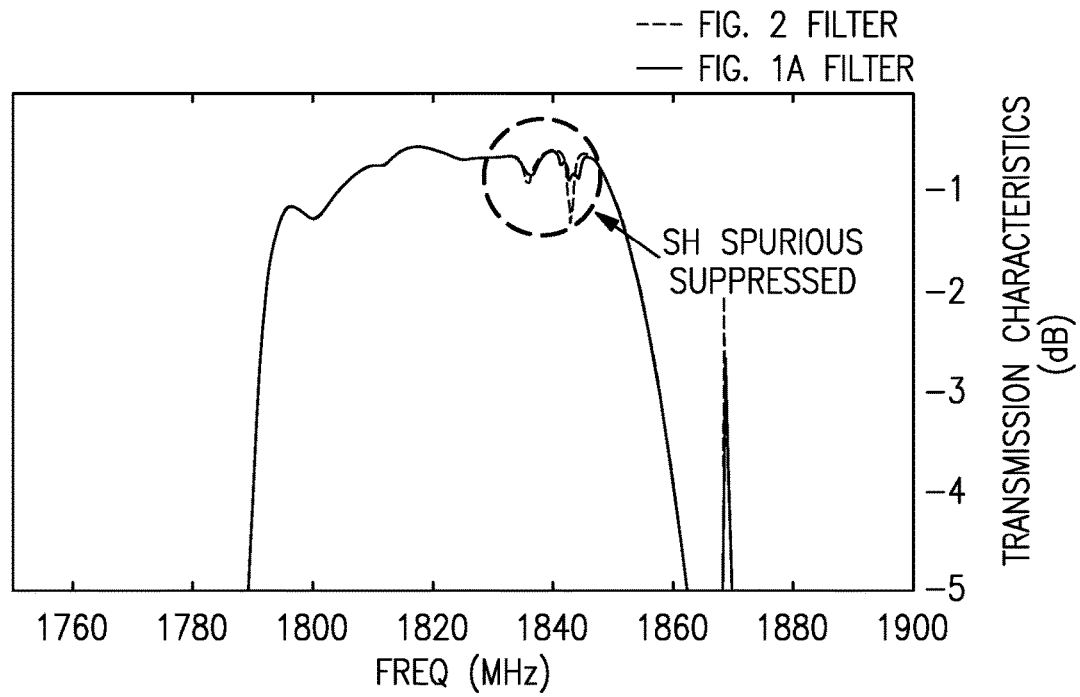
FIG. 3B is a zoomed in graph of part of the graph of FIG. 3A.

FIG. 3A is graph comparing transmission characteristics over frequency for the MMS filter 10 of FIG. 1A and the MMS filter 20 of FIG. 2. FIG. 3B is a zoomed in graph of part of the graph of FIG. 3A. These graphs show that the MMS filter 10 can suppress a spurious response due to SH mode. There is less of a dip in the transmission curve for the MMS filter 10 than for the MMS filter 20. Accordingly, the slanted acoustic reflectors 15 and 16 can provide SH spurious suppression. FIGS. 3A and 3B also indicate that the slanted acoustic reflectors 15 and 16 can suppress a spurious response due to SH mode without significantly degrading electrical performance.

A variety of acoustic reflectors discussed herein can suppress a spurious response due to SH mode of a MMS filter. Additional examples of such MMS filters with acoustic reflectors are described below. Certain embodiments disclosed below include acoustic reflectors having acoustic reflector fingers with stepped length. Any suitable combination of features of these MMS filters can be implemented together with each other. Any suitable principles and advantages of any of the MMS filters disclosed herein can be implemented together with each other.

Figure 4A:
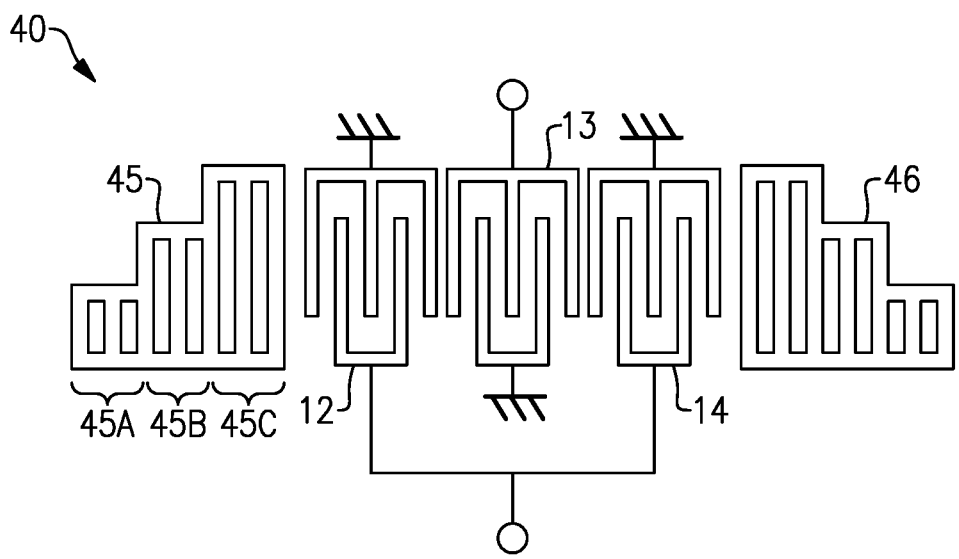
FIG. 4A is a schematic diagram of an MMS filter with a stepped acoustic reflector finger lengths according to an embodiment.

FIG. 4A is a schematic diagram of a MMS filter 40 with a stepped acoustic reflector finger lengths according to an embodiment. An acoustic reflector with stepped finger lengths can be referred to as a stepped acoustic reflector. As illustrated, the MMS filter 40 includes longitudinally coupled IDT electrodes 12, 13, and 14 and stepped acoustic reflectors 45 and 46. The stepped acoustic reflectors 45 and 46 are on opposing sides of the longitudinally coupled IDTs 12, 13, and 14 in plan view.

The acoustic reflectors 45 and 46 can suppress a SH mode spurious. As shown in FIG. 4A, the acoustic reflector 45 includes a first portion 45A, a second portion 45B, and a third portion 45C. Each portion of the acoustic reflector 45 includes a respective group of one or more acoustic reflector fingers having a different length than the one or more acoustic reflector fingers of another group. The lengths of the acoustic reflectors can be arranged such that the acoustic reflector 45 has a stepped shape in plan view. Each groups of one or more acoustic reflector fingers can have any suitable number of acoustic reflector fingers. In the MMS filter 40 illustrated in FIG. 4A, each group of acoustic reflector fingers includes at least two acoustic reflector fingers. The groups of acoustic reflector fingers with relatively longer lengths can be positioned closer to the longitudinally coupled IDT electrodes 12, 13, and 14. The acoustic reflector 46 can be similar to the acoustic reflector 45, except that a mirrored version is positioned on an opposing side of the longitudinally coupled IDT electrodes 12, 13, and 14.

Figure 4B:
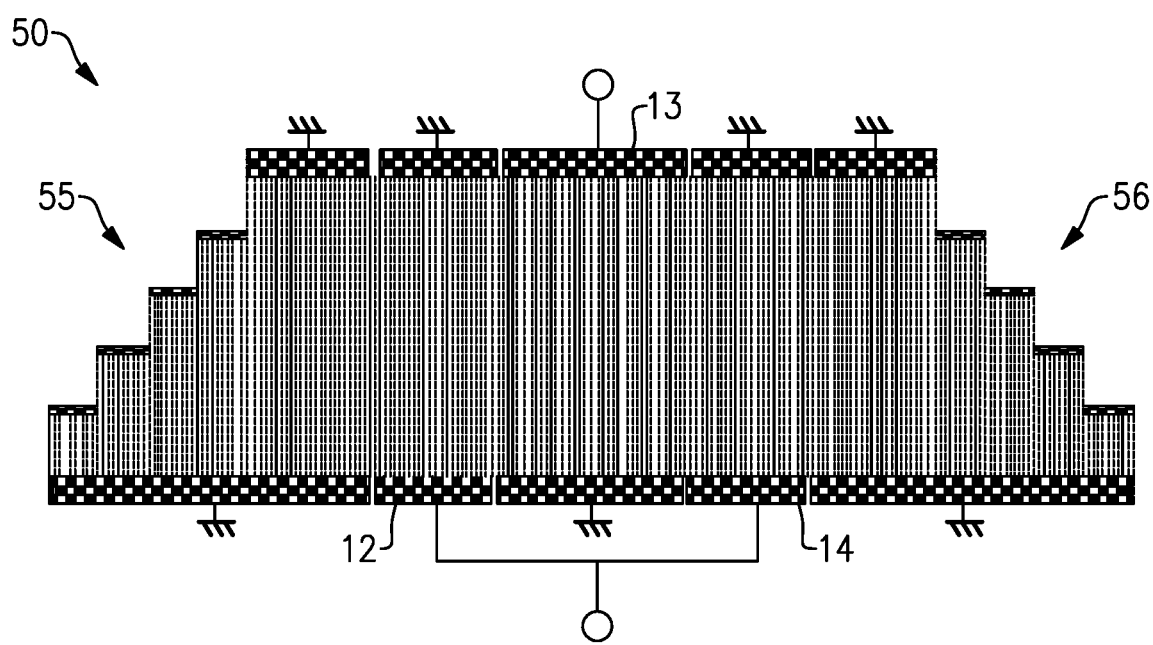
FIG. 4B is a layout diagram of an example MMS filter with stepped acoustic reflector finger lengths according to an embodiment.

FIG. 4B is a layout diagram of an example MMS filter 50 with stepped acoustic reflector finger lengths according to an embodiment. The illustrated MMS filter 50 includes longitudinally coupled IDT electrodes 12, 13, and 14 and acoustic reflectors 55 and 56 with stepped shapes. In the example layout of FIG. 4B, the acoustic reflector 55 has five portions or steps with groups of acoustic reflectors. Any suitable number of steps can be implemented. The number of acoustic reflector fingers in the various steps in FIG. 4B are 35, 30, 25, 20, and 15 in which the steps with larger number of reflectors are positioned closer to the longitudinally coupled IDT electrodes 12, 13, and 14. Any suitable number of one or more acoustic reflector fingers can be included in each step of the acoustic reflector 55. The acoustic reflector 56 is a mirrored version of the acoustic reflector 55 in plan view, in which the acoustic reflectors 55 and 56 are on opposing sides of the longitudinally coupled IDT electrodes 12, 13, and 14 in plan view.

Figure 5A:
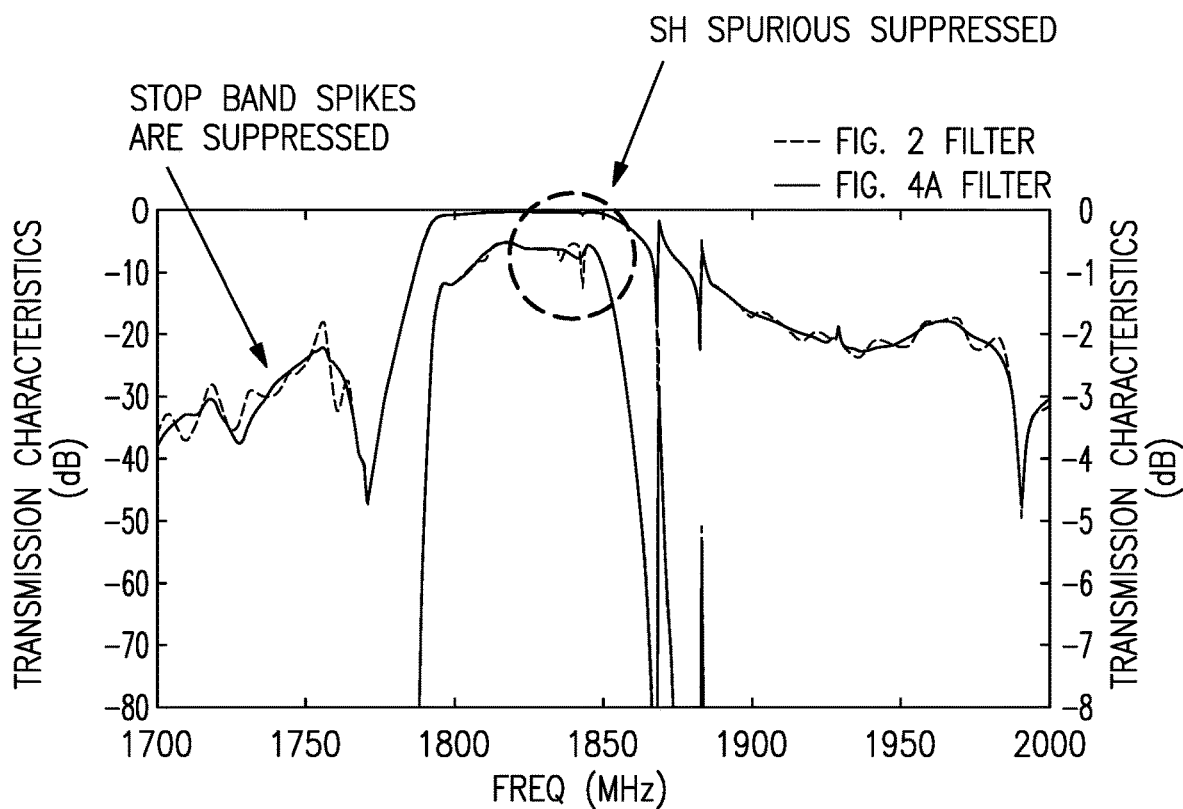
FIG. 5A is graph comparing transmission characteristics over frequency for the MMS filter of FIG. 4A and the MMS filter of FIG. 2.
Figure 5B:
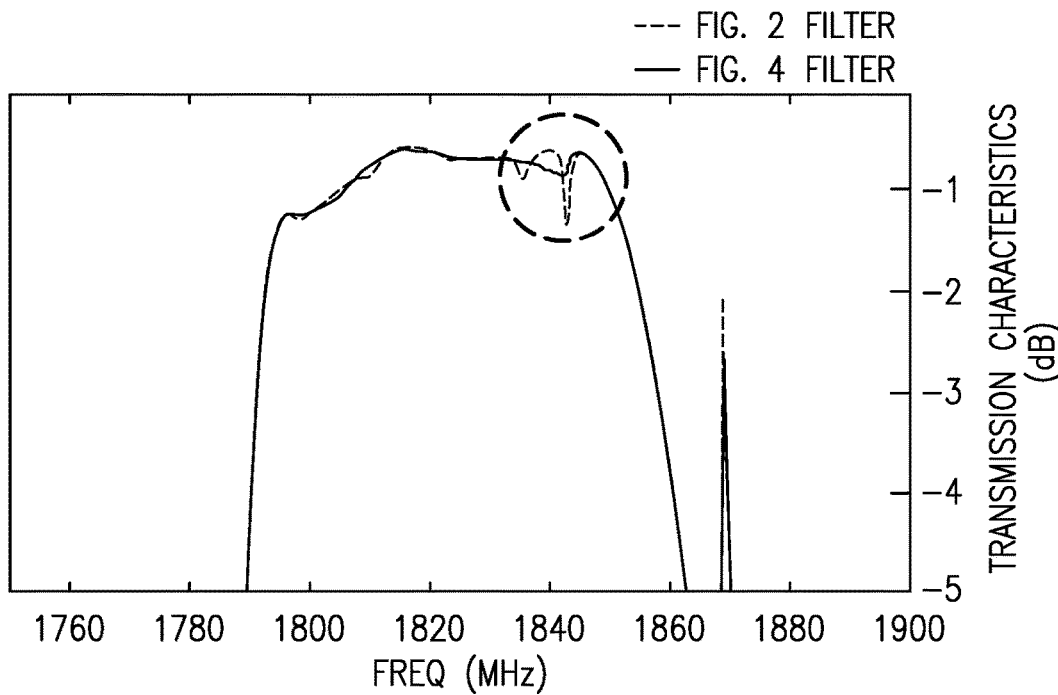
FIG. 5B is a zoomed in graph of part of the graph of FIG. 5A.

FIG. 5A is graph comparing transmission characteristics over frequency for the MMS filter 40 of FIG. 4A and the MMS filter 20 of FIG. 2. FIG. 5B is a zoomed in graph of part of the graph of FIG. 5A. These graphs show that the MMS filter 40 can suppress a spurious response due to SH mode. FIGS. 5A and 5B also indicate that the stepped acoustic reflectors 45 and 46 can suppress a spurious response due to SH mode without significantly degrading electrical performance. In addition, FIG. 5A indicates that the stepped acoustic reflectors 45 and 46 can suppress spikes in a stop band of a MMS filter.

Figure 6:
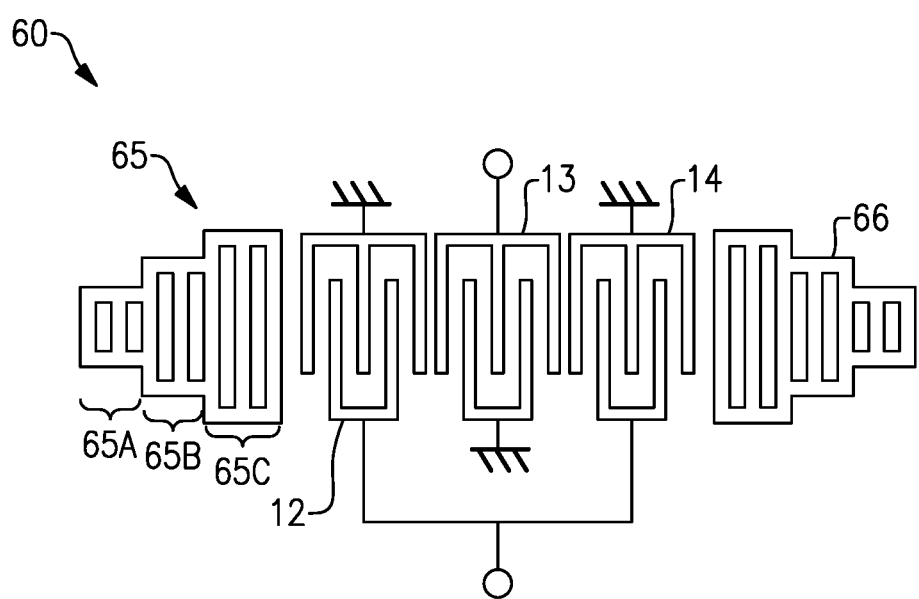
FIG. 6 is a schematic diagram of an MMS filter with a stepped acoustic reflector finger lengths that is symmetric about an aperture direction according to an embodiment.

FIG. 6 is a schematic diagram of a MMS filter 60 with stepped acoustic reflectors that is symmetric about an aperture direction according to an embodiment. The MMS filter 60 is similar to the MMS filter 40 of FIG. 4, except that stepped acoustic reflectors 65 and 66 are symmetric about the aperture direction. The aperture direction can generally extend along a length of a center finger of the longitudinally coupled IDT electrodes of the MMS filter 60. The illustrated acoustic reflector 65 includes a first portion 65A, a second portion 65B, and a third portion 65C. Each portion of the stepped acoustic reflector 65 includes a respective group of acoustic reflector fingers having a different length than acoustic reflector fingers of another group.

Figure 7:
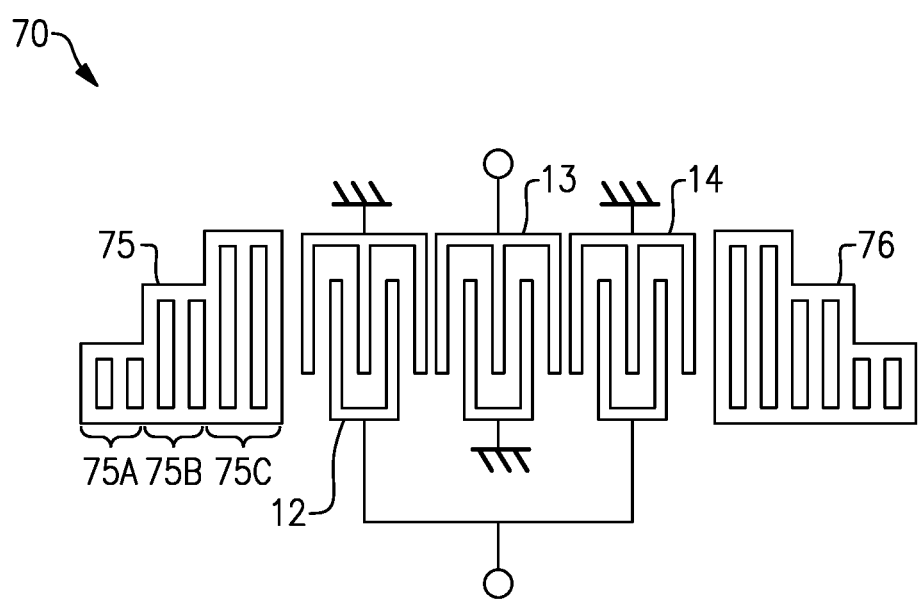
FIG. 7 is a schematic diagram of an MMS filter with a stepped acoustic reflector finger lengths with pitch modulation according to an embodiment.

FIG. 7 is a schematic diagram of a MMS filter 70 with a stepped acoustic reflectors with pitch modulation according to an embodiment. The MMS filter 70 is similar to the MMS filter 40 of FIG. 4, except that stepped acoustic reflectors 75 and 76 each include portions with different pitch widths. For example, the illustrated stepped acoustic reflector 75 includes a first portion 75A, a second portion 75B, and a third portion 75C. Each portion of the stepped acoustic reflector 75 has a different pitch.

Figure 8:
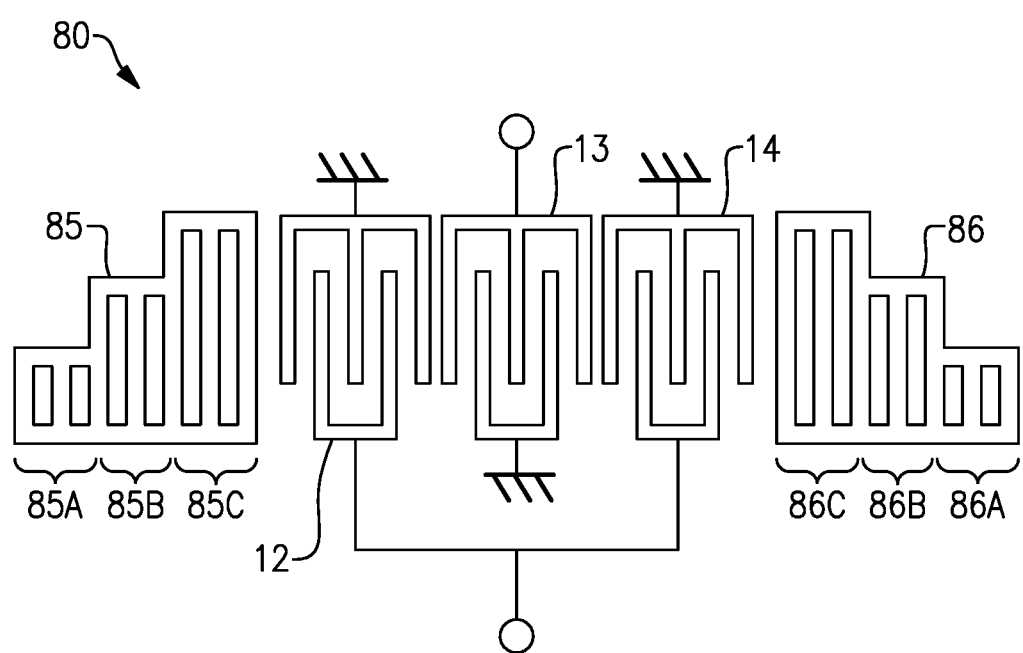
FIG. 8 is a schematic diagram of an MMS filter with a stepped acoustic reflector finger lengths and acoustic reflector pitches that are different on opposing sides of IDTs of the MMS filter according to an embodiment.

FIG. 8 is a schematic diagram of a MMS filter 80 with a stepped acoustic reflectors that are different on opposing sides of IDTs of the MMS filter according to an embodiment. The MMS filter 80 is similar to the MMS filter 40 of FIG. 4, except that stepped acoustic reflectors 85 and 86 have different pitches than each other. For example, the stepped acoustic reflector 85 can have a larger pitch than the acoustic reflector 86. In this example, portions 85A, 85B, and 85C of the stepped acoustic reflector 85 have larger pitches than portions 86A, 86B, and 86C of the stepped acoustic reflector 86. Each portion of a stepped acoustic reflector can have the same pitch as other portion(s) of the same stepped acoustic reflector. Alternatively, one or more portions of a stepped acoustic reflector can have a different pitch as one or more other portions of the same stepped acoustic reflector.

Figure 9:
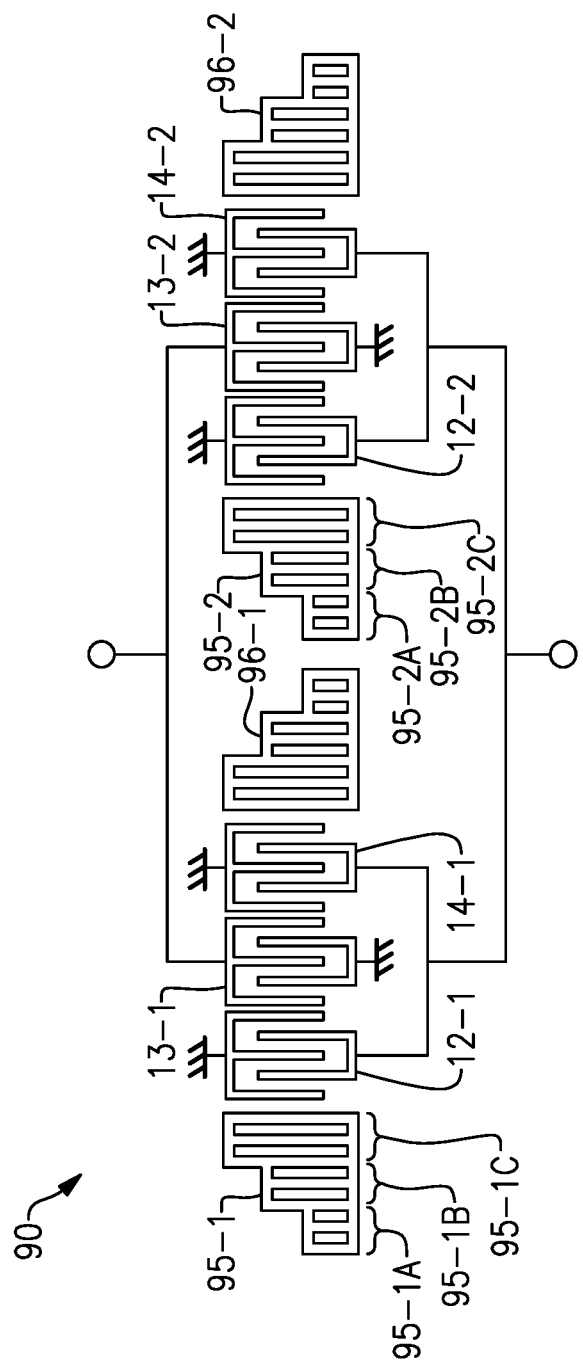
FIG. 9 is a schematic diagram of an MMS filter with first IDTs and second IDTs in parallel with each other according to an embodiment.

FIG. 9 is a schematic diagram of a MMS filter 90 with first longitudinally coupled IDT electrodes 12-1, 13-1, and 14-1 and second longitudinally coupled IDT electrodes 12-2, 13-2, and 14-2 in parallel with each other. The MMS filter 90 provides a combination of parallel connected groups of IDTs having different acoustic reflectors pitches on opposing sides of each group of IDTs. First stepped acoustic reflectors 95-1 and 96-1 are on opposing sides of the first longitudinally coupled IDTs 12-1, 13-1, and 14-1. Similarly, second stepped acoustic reflectors 95-2 and 96-2 are on opposing sides of the second longitudinally coupled IDTs 12-2, 13-2, and 14-2. The first stepped acoustic reflectors 95-1 and 96-1 can have different pitches than the second stepped acoustic reflectors 95-2 and 96-2. For instance, portions 95-1A, 95-1B, and 95-1C of the stepped acoustic reflector 95-1 can have larger pitches than portions 95-2A, 95-2B, and 95-2C of the stepped acoustic reflector 95-2. Similarly, portions 96-1A, 96-1B, and 96-1C of the stepped acoustic reflector 96-1 can have larger pitches than portions 96-2A, 96-2B, and 96-2C of the stepped acoustic reflector 96-2. The pitches of the portions 95-1A, 95-1B, and 95-1C of the stepped acoustic reflector 95-1 can be the same as pitches of the portions 96-1A, 96-1B, and 96-1C of the stepped acoustic reflector 96-1. The pitches of the portions 95-2A, 95-2B, and 95-2C of the stepped acoustic reflector 95-2 can be the same as pitches of the portions 96-2A, 96-2B, and 96-2C of the stepped acoustic reflector 96-2.

Figure 10:
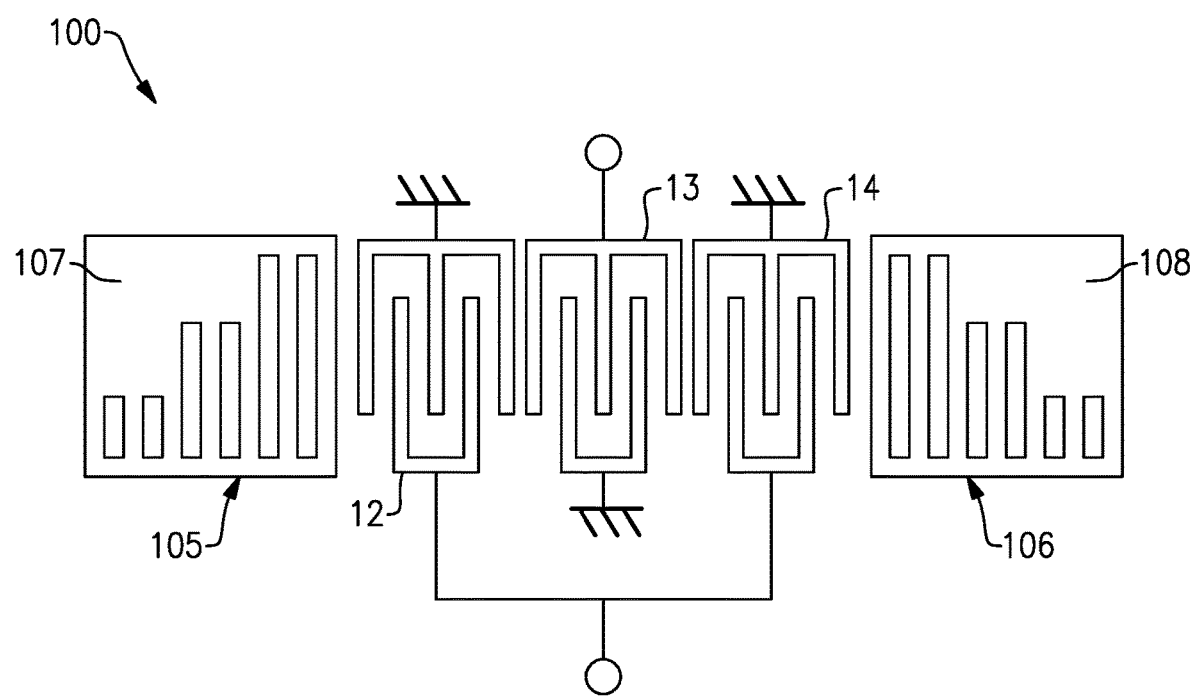
FIG. 10 is a schematic diagram of an MMS filter with a stepped acoustic reflector finger lengths and metal fill according to an embodiment.

FIG. 10 is a schematic diagram of a MMS filter 100 with a stepped acoustic reflector pitches and metal fill according to an embodiment. The MMS filter 100 is similar to the MMS filter 40 of FIG. 4, except that stepped acoustic reflectors 105 and 106 include metal fill portions 107 and 108, respectively. In the acoustic reflectors 105 and 106, acoustic reflector fingers extend between a respective bus bar and an opposing metal fill portions 107 or 108. The metal fill portions 107 and 108 can be considered parts of respective bus bars.

Figure 11A:
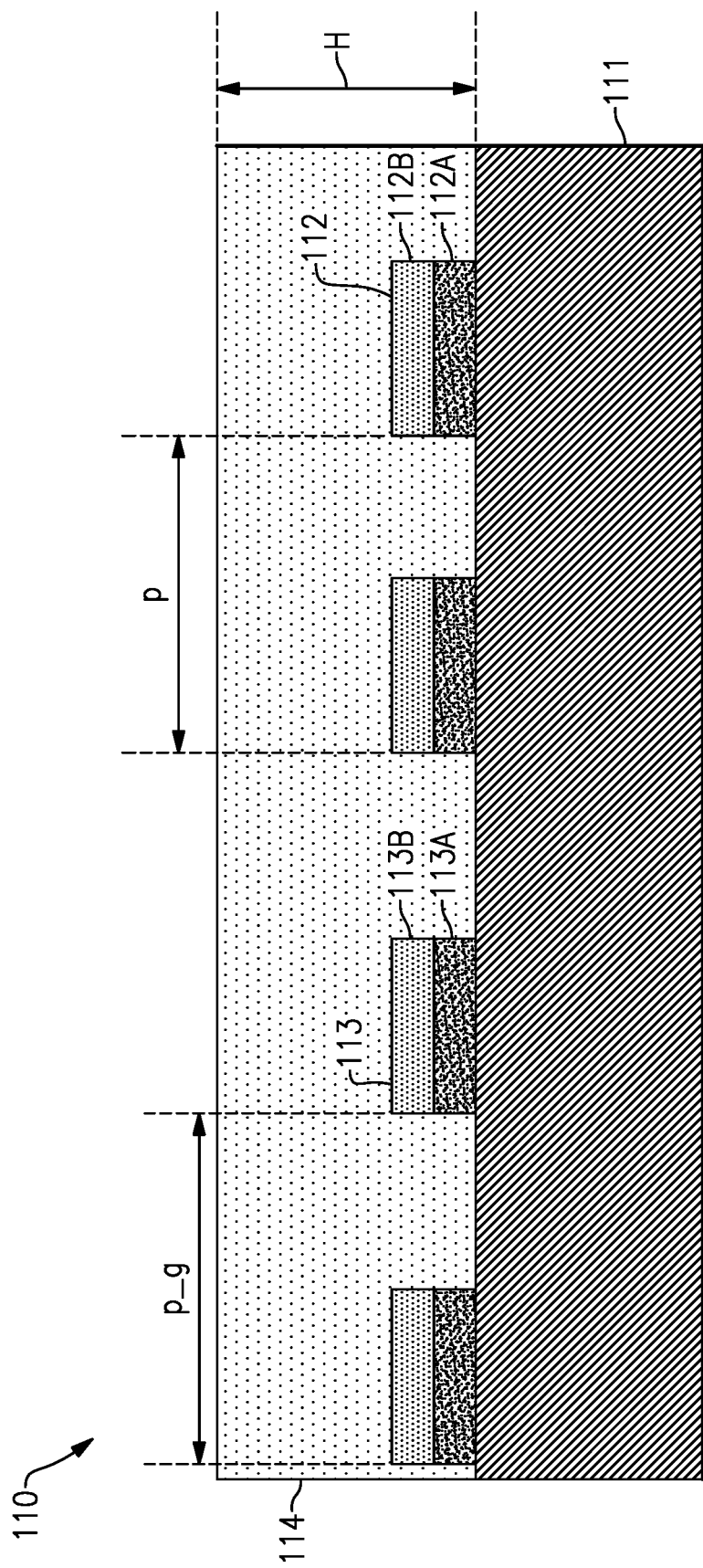
FIG. 11A is a cross sectional view of a portion of an MMS filter according to an embodiment.
Figure 11B:
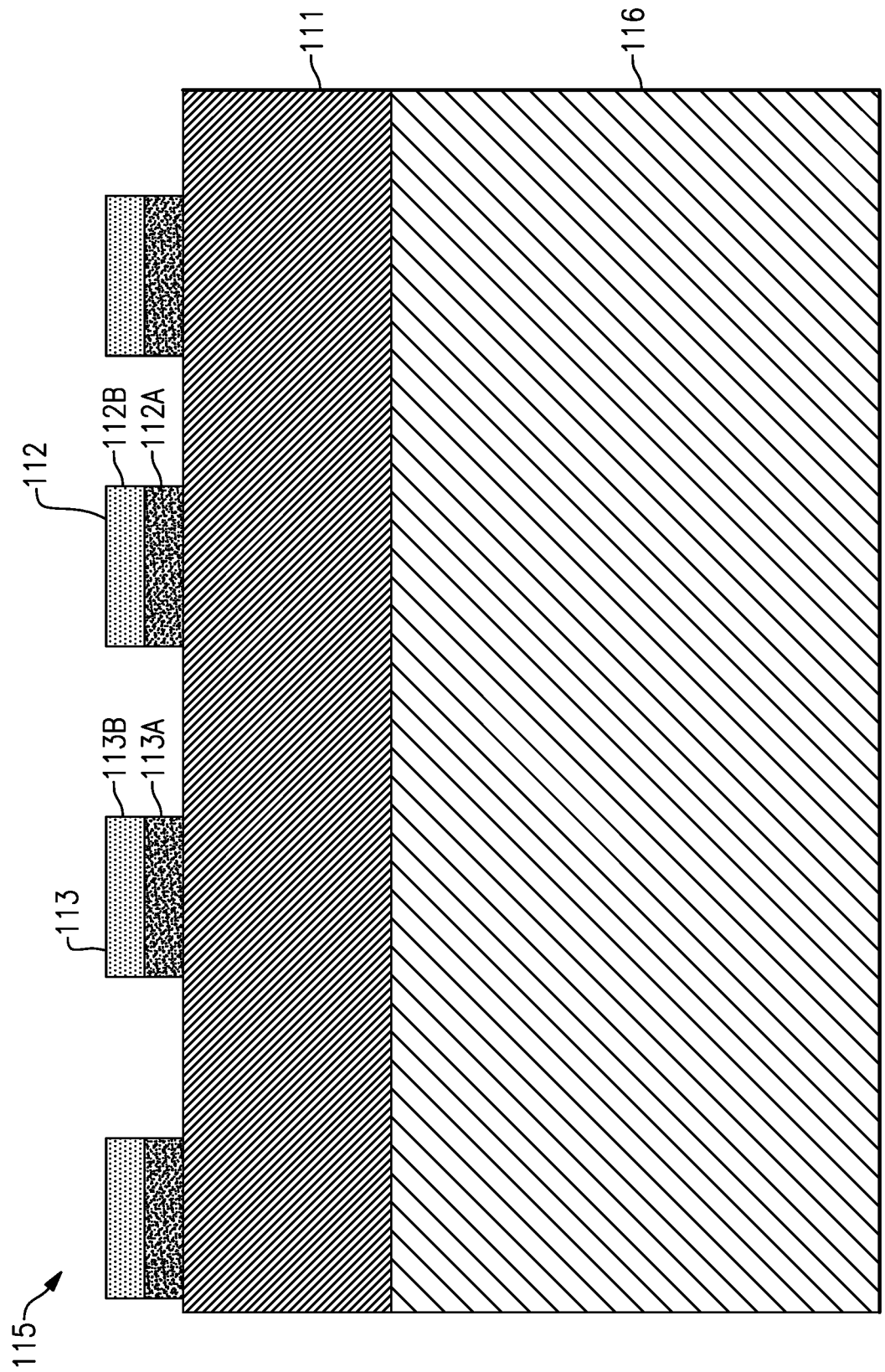
FIG. 11B is a cross sectional view of a portion of an MMS filter with a multi-layer piezoelectric substrate according to an embodiment.

Example cross sectional views of portions of respective MMS filters will be described with reference to FIGS. 11A to 11D. FIG. 11A illustrates that an MMS filter can be a temperature compensated MMS filter. FIG. 11B illustrate that an MMS filter can include a multi-layer piezoelectric substrate. Any suitable features of these MMS filters can be implemented together with each other. Any suitable features of the MMS filters of FIGS. 11A to 11D can be implemented in any of the MMS filters disclosed herein, such as any of the MMS filters of FIG. 1A, 1B, 1D, 4A, 4B, 6, 7, 8, 9, or 10. Moreover, any suitable features of the MMS filters of one or more of FIGS. 11A to 11D can be implemented in association with a MMS filter that include features of two or more MMS filters disclosed herein.

FIG. 11A is a cross sectional view of a portion of a MMS filter 110 according to an embodiment. The illustrated cross section includes a portion of one IDT electrode and one acoustic reflector of the MMS filter 110. As illustrated in FIG. 11A, the MMS filter 110 includes a piezoelectric layer 111, an IDT electrode 112, an acoustic reflector 113, and a temperature compensation layer 114 over the IDT electrode 112. With the temperature compensation layer 114, the MMS filter 110 can be referred to as a temperature compensated MMS filter.

The piezoelectric layer 111 can be any suitable piezoelectric layer. For example, the piezoelectric layer 111 can be a lithium niobate layer or a lithium tantalate layer. A piezoelectric layer 111 that is lithium niobate can have a cut angle in a range from 116° to 132°, for example. As another example, a piezoelectric layer 111 that is lithium niobate can have a cut angle in a range from 110° to 135°. In certain applications, the piezoelectric layer 111 can be a lithium niobate layer having a cut angle of 128°. A "cut angle" of N° can refer to an N° rotated Y-cut in a Y-cut X-propagation piezoelectric layer. Accordingly, for a piezoelectric layer with Euler angles ($\varphi$, $\theta$, $\psi$), the "cut angle" in degrees can be $\theta$ minus 90°. An MMS filter can include a multi-layer piezoelectric substrate in certain instances, for example, as will be discussed with reference to FIGS. 11B, 11C, and 11D.

In the MMS filter 110, the IDT 114 is over the piezoelectric layer 111. The IDT electrode 112 includes a first IDT electrode layer 112A and a second IDT electrode layer 112B. The first IDT electrode layer 112A can be referred to as a lower electrode layer. The first IDT electrode layer 112A is disposed between the second IDT electrode layer 112B and the piezoelectric layer 111. As illustrated, the first IDT electrode layer 112A has a first side in physical contact with the piezoelectric layer 111 and a second side in physical contact with the second IDT electrode layer 112B.

The first IDT electrode layer 112A can impact acoustic properties of the MMS filter 110. The first IDT electrode layer 112A can include copper (Cu), titanium (Ti), silver (Ag), gold (Au), molybdenum (Mo), tungsten (W), ruthenium (Ru), platinum (Pt), iridium (Ir), or any suitable combination thereof. For instance, the first IDT electrode layer 112A can be a molybdenum layer in certain applications.

The second IDT electrode layer 112B can be referred to as an upper electrode layer. The second IDT electrode layer 112B is disposed between the first IDT electrode layer 112A and the temperature compensation layer 114. As illustrated, the second IDT electrode layer 112B can include a first side in physical contact with the first electrode layer 112A and a second side in physical contact with the temperature compensation layer 114. The second IDT electrode layer 112B can impact electrical properties of the MMS filter 110. The second IDT electrode layer 112B can include aluminum (Al) or any suitable alloy thereof.

The acoustic reflector 113 can include a first acoustic reflector layer 113A and a second acoustic reflector layer 113B. The first acoustic reflector layer 113A can be of the same material as the first IDT electrode layer 112A. The second acoustic reflector layer 113B can be of the same material as the second IDT electrode layer 112B. In some instances, the acoustic reflector 113 can include a different material and/or a different number of layers than the IDT 112 electrode of the MMS filter 110.

The IDT electrode 112 of the MMS filter 110 has a pitch of p. A portion of the acoustic reflector 113 of the MMS filter 110 has a pitch of p_g. The pitch p_g of the portion of the acoustic reflector 113 can be greater than the pitch p of the IDT electrode 112. The acoustic reflector 113 can include multiple additional acoustic reflector fingers that are not illustrated in FIG. 11A. The acoustic reflector 113 can include slanted pitches and/or stepped acoustic reflector finger lengths in accordance with any suitable principles and advantages disclosed herein.

In the MMS filter 110, the temperature compensation layer 114 can bring a temperature coefficient of frequency (TCF) of the MMS filter 110 closer to zero. The temperature compensation layer 114 can have a positive TCF. This can compensative for a negative TCF of the piezoelectric layer 111, as various piezoelectric layers such as lithium niobate and lithium tantalate have a negative TCF. The temperature compensation layer 114 can be a dielectric film. The temperature compensation layer 114 can be a silicon dioxide layer. In some other embodiments, a different temperature compensation layer can be implemented. Some examples of other temperature compensation layers include another silicon oxide layer (e.g., SiO), a tellurium dioxide ($TeO_2$) layer or a silicon oxyfluoride (SiOF) layer. The temperature compensation layer 114 can have a thickness H in a range from about 0.2p to 1.0p, in which p is the pitch of the IDT electrode 112.

FIG. 11B is a cross sectional view of a portion of an MMS filter 115 with a multi-layer piezoelectric substrate according to an embodiment. The MMS filter 115 is like the MMS filter 110 of FIG. 11A except that the MMS filter 115 additionally includes a support substrate 116 on a side of the piezoelectric layer 111 that is opposite to the IDT electrode 112 and does not include a temperature compensation layer. FIG. 11B illustrates that an acoustic reflector arranged to suppress a spurious response due to SH mode can be implemented in a MMS filter with a multi-layer piezoelectric substrate. In certain applications, the piezoelectric layer 111 can have a thickness of less than the pitch p of the IDT 112 in the MMS filter 115.

The support substrate 116 can be any suitable substrate layer, such as a silicon layer, a quartz layer, a ceramic layer, a glass layer, a spinel layer, a magnesium oxide spinel layer, a sapphire layer, a diamond layer, a silicon carbide layer, a silicon nitride layer, an aluminum nitride layer, or the like. As one example, the MMS filter 115 can include a lithium niobate/silicon piezoelectric substrate in certain applications.

The support substrate 116 can have a relatively high impedance. An acoustic impedance of the support substrate 116 can be higher than an acoustic impedance of the piezoelectric layer 111. For instance, the support substrate 116 can have a higher acoustic impedance than an acoustic impedance of lithium niobate. The MMS filter 115 including the piezoelectric layer 111 on a high impedance support substrate 116, such as silicon substrate, can achieve better TCF and thermal dissipation compared to a similar MMS filter without the high impedance support substrate 116.

Figure 11C:
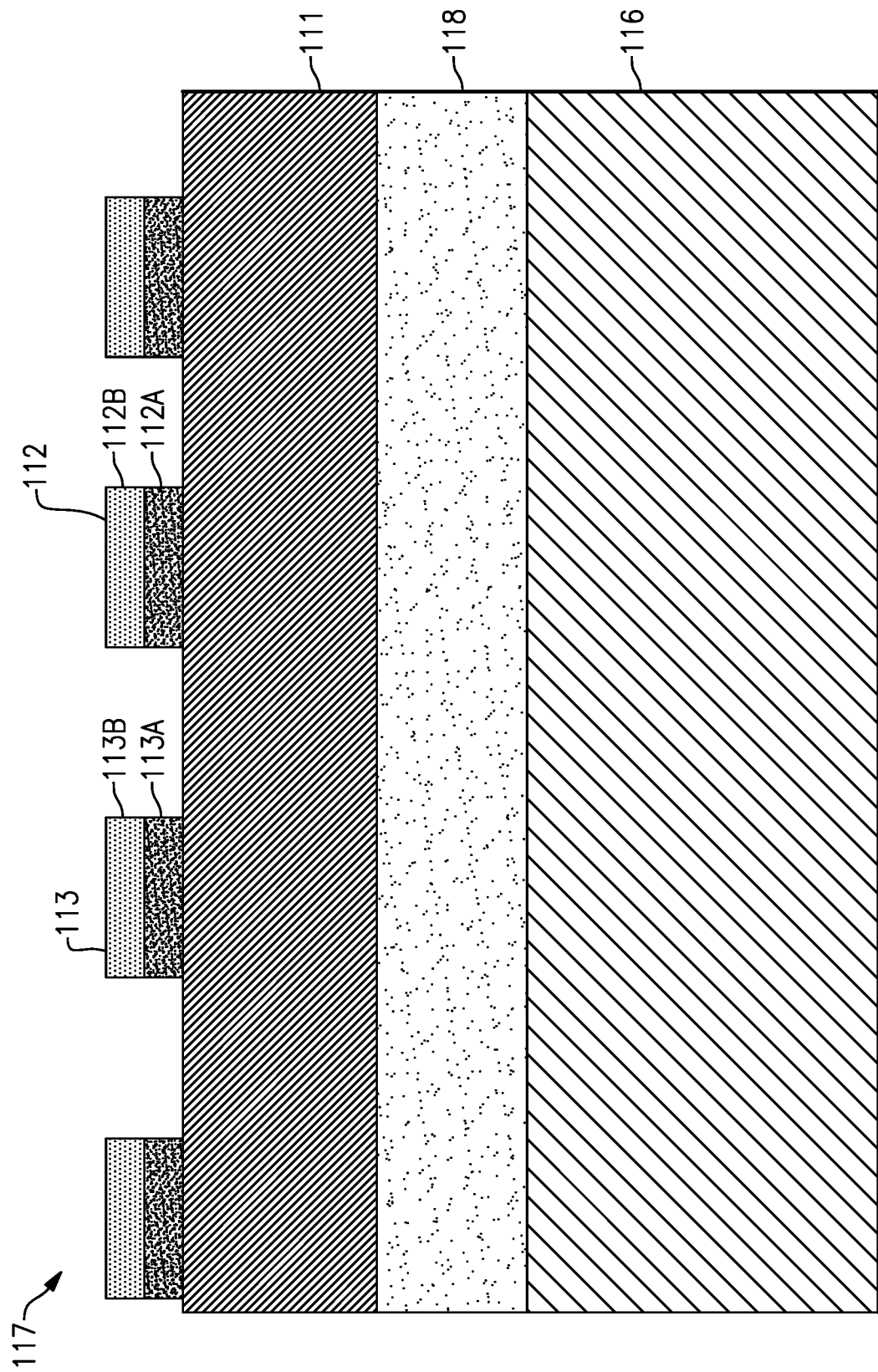
FIG. 11C is a cross sectional view of a portion of an MMS filter with a multi-layer piezoelectric substrate according to another embodiment.

In certain embodiments, an MMS filter can include two or more layers on the side of the piezoelectric layer 111 that is opposite to the IDT electrode 112. FIG. 11C is a cross sectional view of a portion of an MMS filter 117 with a multi-layer piezoelectric substrate according to an embodiment. The MMS filter 117 is like the MMS filter 115 of FIG. 11B except that the MMS filter 117 also includes an additional layer 118 positioned between the piezoelectric layer 111 and the support substrate 116.

The additional layer 118 can be a low impedance layer that has a lower acoustic impedance than the support substrate 116. In some embodiments, the additional layer 118 can be a silicon dioxide ($SiO2$) layer. The additional layer 118 can increase adhesion between layers of the multi-layer piezoelectric substrate. In such applications, the additional layer 118 can be referred to as an adhesion layer. Alternatively or additionally, the additional layer 118 can increase heat dissipation in the MMS filter 117 relative to the MMS filter 115. In such applications, the additional layer 118 can be referred to as a heat dissipation layer. The additional layer 118 can reduce back reflection of the support substrate 116 in certain applications. In such applications, the additional layer 118 can scatter back reflections by beam scattering. In some instances, the additional layer 118 can be a polycrystalline spinel layer and the support substrate 116 can be a silicon layer.

Figure 11D:
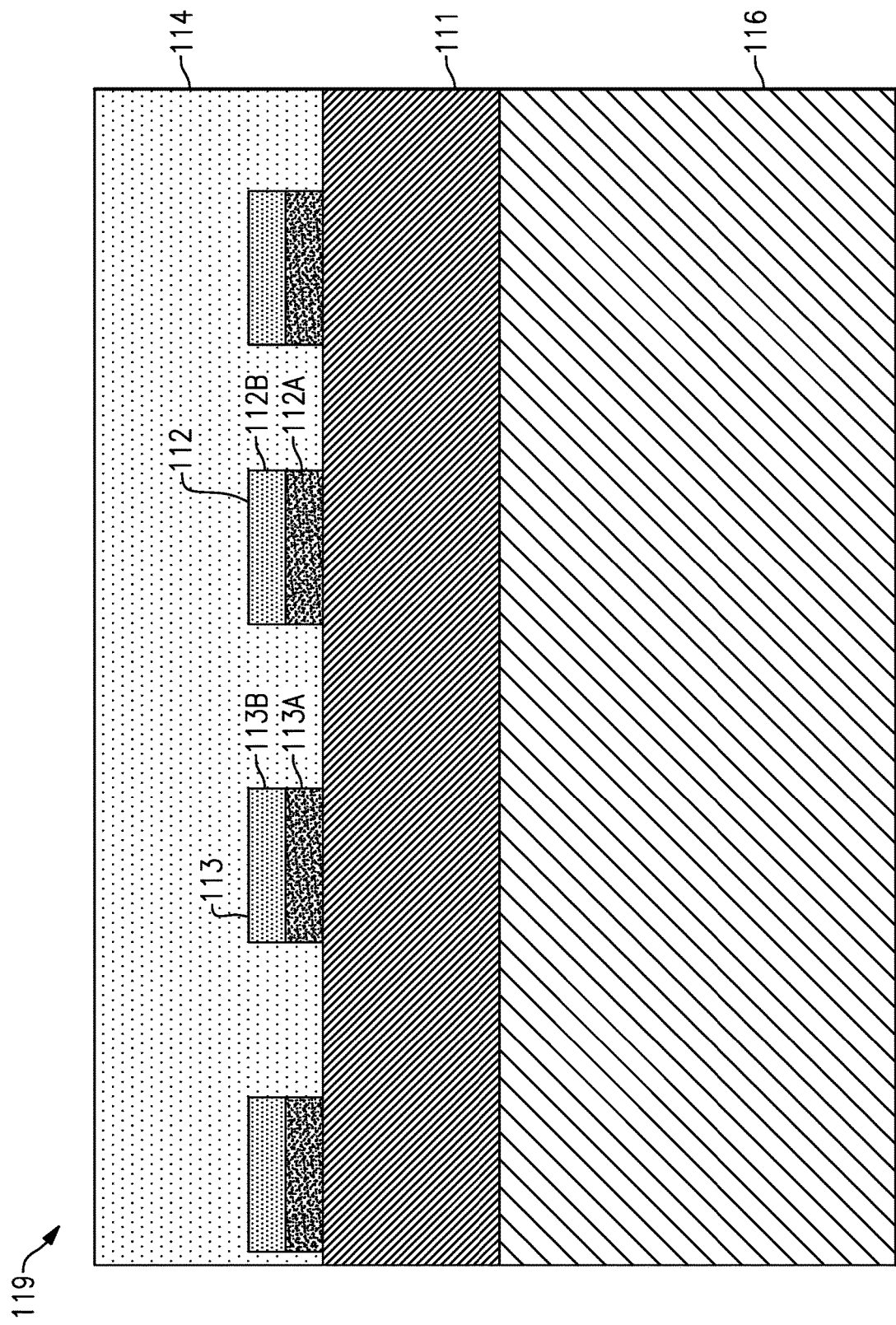
FIG. 11D is a cross sectional view of a portion of an MMS filter with a multi-layer piezoelectric substrate according to another embodiment.

FIG. 11D is a cross sectional view of a portion of an MMS filter 119 with a multi-layer piezoelectric substrate according to another embodiment. The MMS filter 119 is like the MMS filter 115 of FIG. 11B except that the MMS filter 119 is implemented with a temperature compensation layer 114 over the interdigital transducer 112 on a side of the piezoelectric layer 111 opposite to the support substrate 116. In the MMS filter 119, the acoustic impedance of the support substrate 116 can be higher than an acoustic impedance of the temperature compensation layer 114. For instance, the support substrate 116 can have a higher acoustic impedance than an acoustic impedance of silicon dioxide.

FIG. 11D illustrates an example of an MMS filter with a multi-layer piezoelectric substrate below a piezoelectric layer and a temperature compensation layer over the piezoelectric layer. Such a temperature compensation layer can be included over any suitable MMS filters with a multi-layer piezoelectric substrate. For example, a temperature compensation layer 114 can be implemented over the MMS filter 117 of FIG. 11C in another embodiment (not illustrated).

The acoustic wave filters disclosed herein can be implemented in a variety of packaged modules. A module that includes a radio frequency component can be referred to as a radio frequency module. Example radio frequency modules will now be described in which any suitable principles and advantages of the acoustic wave filters disclosed herein can be implemented. A radio frequency module can include one or more features of the radio frequency module of FIG. 12 and/or the radio frequency module of FIG. 13A and/or the radio frequency module of FIG. 13B.

Figure 12:
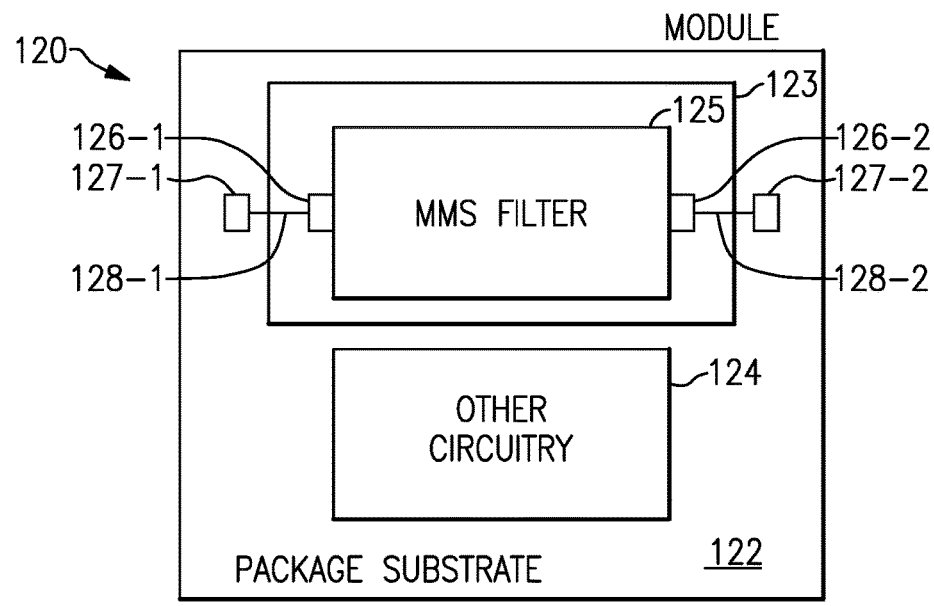
FIG. 12 is a schematic diagram of a radio frequency module that includes an MMS filter according to an embodiment.

FIG. 12 is a schematic diagram of a radio frequency module 120 that includes a SAW component 123 according to an embodiment. The illustrated radio frequency module 120 includes the SAW component 123 and other circuitry 124. SAW component 123 includes a MMS filter 125 that can include any suitable combination of features of the MMS filters disclosed herein. The SAW component 123 includes a SAW die that includes one or more MMS filters 125. The SAW component 123 can include SAW resonators of one or more other filters and/or coupled to the MMS filter 125. The SAW component 123 can include one or more IDT electrodes arranged as delay elements in one or more cancellation circuits.

The SAW component 123 shown in FIG. 12 includes the MMS filter 125 and terminals 126-1 and 126-2. The terminals 126-1 and 126-2 can serve, for example, as an input contact and an output contact. The SAW component 123 and the other circuitry 124 are on a common packaging substrate 122 in FIG. 12. The package substrate 122 can be a laminate substrate. The terminals 126-1 and 126-2 can be electrically connected to contacts 127-1 and 127-2, respectively, on the packaging substrate 122 by way of electrical connectors 128-1 and 128-2, respectively. The electrical connectors 128-1 and 128-2 can be bumps or wire bonds, for example.

The other circuitry 124 can include any suitable additional circuitry. For example, the other circuitry can include one or more radio frequency amplifiers (e.g., one or more power amplifiers and/or one or more low noise amplifiers), one or more radio frequency switches, one or more additional filters, one or more delay lines, one or more power detectors, the like, or any suitable combination thereof. The radio frequency module 120 can include one or more packaging structures to, for example, provide protection and/or facilitate easier handling of the radio frequency module 120. Such a packaging structure can include an overmold structure formed over the packaging substrate 122. The overmold structure can encapsulate some or all of the components of the radio frequency module 120.

Figure 13A:
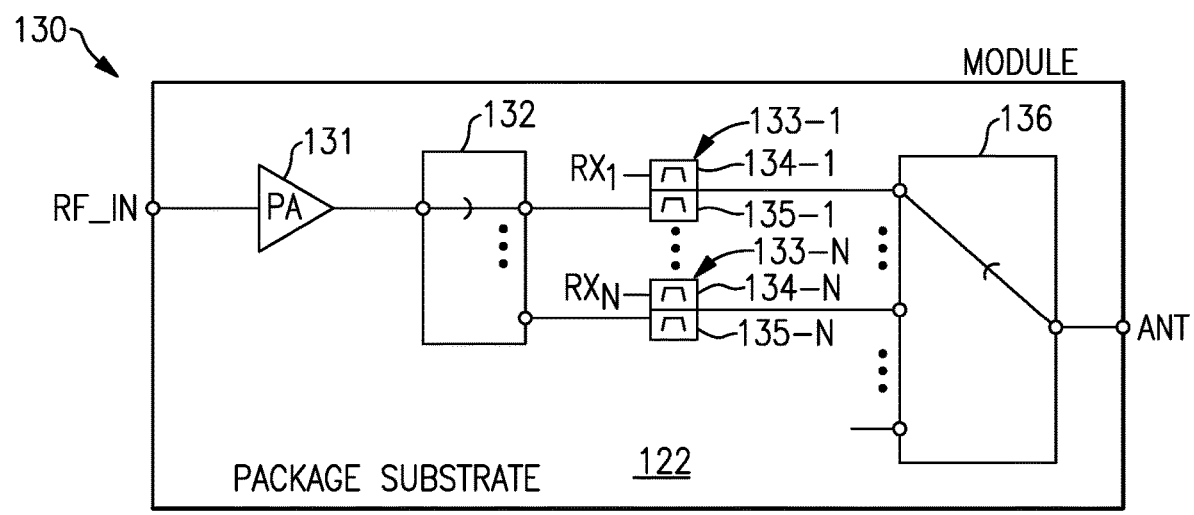
FIG. 13A is a schematic diagram of a radio frequency module that includes an MMS filter according to an embodiment.

FIG. 13A is a schematic diagram of a radio frequency module 130 that includes a MMS filter according to an embodiment. As illustrated, the radio frequency module 130 includes a power amplifier 131, a select switch 132, duplexers 133-1 to 133-N that include receive filters 134-1 to 134-N and respective transmit filters 135-1 to 135-N, and an antenna switch 136. The radio frequency module 130 can include a package that encloses the illustrated elements. The illustrated elements can be disposed on a common packaging substrate 122. The packaging substrate 122 can be a laminate substrate, for example.

The duplexers 133-1 to 133-N can each include two acoustic wave filters coupled to a common node. The two acoustic wave filters can be a transmit filter and a receive filter. As illustrated, the transmit filter and the receive filter can each be a band pass filter arranged to filter a radio frequency signal. One or more of the receive filters 134-1 to 134-N can include a MMS filter in accordance with any suitable principles and advantages disclosed herein. Although FIG. 13 illustrates duplexers, any suitable principles and advantages disclosed herein can be implemented in other multiplexers (e.g., quadplexers, hexaplexers, octoplexers, etc.) with hard multiplexing and/or with one or more filters coupled to a common node via a switch.

The power amplifier 131 can amplify a radio frequency signal. The illustrated switch 132 is a multi-throw radio frequency switch. The switch 132 can electrically couple an output of the power amplifier 131 to a selected transmit filter of the transmit filters 135-1 to 135-N. In some instances, the switch 132 can electrically connect the output of the power amplifier 131 to more than one of the transmit filters 135-1 to 135-N. The receive filters 134-1 to 135-N can be coupled to one or more low noise amplifiers. In some instances, a switch can selectively couple one or more of the receive filters 134-1 to 135-N to a low noise amplifier. According to certain applications, one or more of the receive filters 134-1 to 135-N can be electrically connected to a respective low noise amplifier without an intervening switch. In some instances, the radio frequency module 130 can include one or more low noise amplifiers. Alternatively or additionally, one or more low noise amplifiers in communication with one or more of the receive filters 134-1 to 135-N can be external to the module 130. The antenna switch 136 can selectively couple a signal from one or more of the duplexers 131-1 to 131-N to an antenna port ANT. The duplexers 131-1 to 131-N can be associated with different frequency bands and/or different modes of operation (e.g., different power modes, different signaling modes, etc.).

Figure 13B:
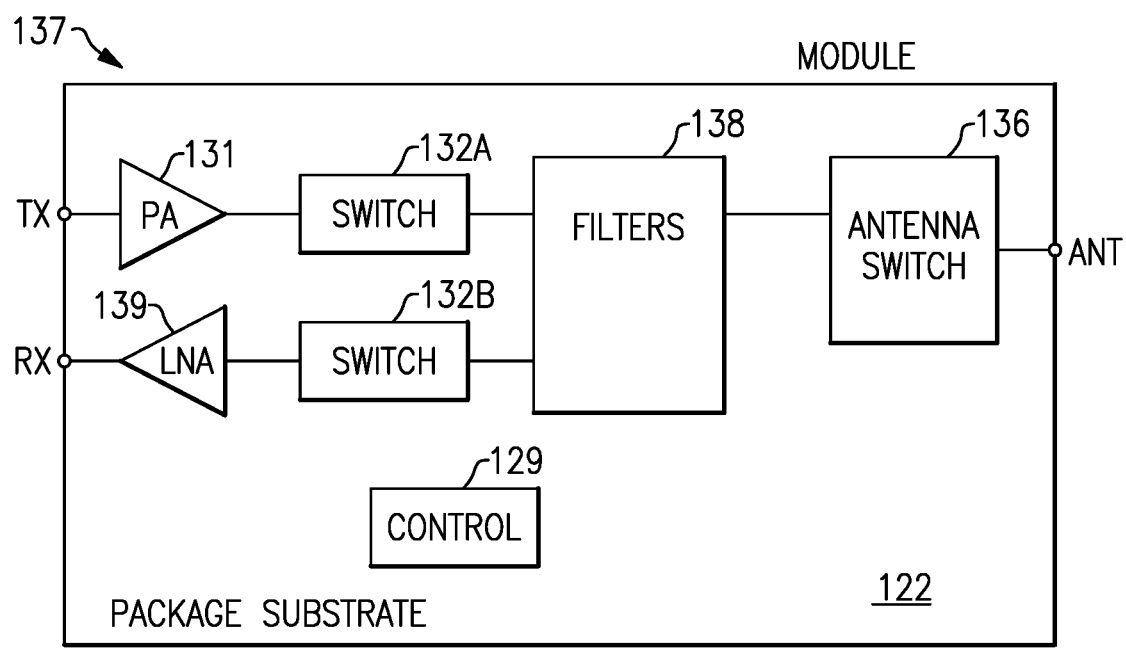
FIG. 13B is a schematic diagram of another radio frequency module that includes an MMS filter according to an embodiment.

FIG. 13B is a schematic diagram of a radio frequency module 137 that includes an MMS filter according to an embodiment. Filters 138 of the radio frequency module include one or more MMS filters in accordance with any suitable principles and advantage disclosed herein. As illustrated, the module 137 includes a power amplifier 131, a first select switch 132A, filters 138, an antenna switch 136, a second select switch 132B, a low noise amplifier 139, and a control circuit 129. These elements are included on a packaging substrate 122. The packaging substrate 122 can be a laminate substrate, for example.

The power amplifier 131 can receive a radio frequency signal from a transmit port TX. In some instances, a switch can electrically connect a selected one of a plurality of transmit ports to an input of the power amplifier 131. The power amplifier 131 can operate in an envelope tracking mode and/or an average power tracking mode. The select switch 132A can be a multi-throw radio frequency switch configured to electrically connect an output of the power amplifier 131 to one or more selected transmit filters of the filters 138. The select switch 132A can be a band select switch arranged to electrically connect the output of the power amplifier 131 to a transmit filter for a particular frequency band.

The filters 138 can be acoustic wave filters. One or more filters of filters 138 can include an MMS filter in accordance with any suitable principles and advantages disclosed herein. For example, one or more receive filters of the filters 138 can include an MMS filter of any of the embodiments disclosed herein. The filters 138 can include a plurality of duplexers and/or other multiplexers. Alternatively or additionally, the filters 138 can include one or more standalone transmit filters and/or one or more standalone receive filters.

As illustrated, the filters 138 are electrically connected to the antenna switch 136. The antenna switch 136 can be a multi-throw radio frequency switch arranged to electrically connect one or more filters of the filters 138 to an antenna port ANT of the module 137. The antenna switch 136 can include at least eight throws in some applications. In certain applications, the antenna switch 136 can include at least ten throws.

The switch 132B can electrically connect a selected receive filter of the filters 138 to a low noise amplifier 139. The low noise amplifier 139 is arranged to amplify the received radio frequency signal and provide an output to a receive port RX. In some instances, another switch can be electrically coupled between the low noise amplifier 139 and the receive port RX. In certain applications, a receive filter of the filters 138 can be electrically connected to the low noise amplifier 139 without an intervening switch.

The illustrated module 137 also includes a control circuit 129. The control circuit 129 can perform any suitable control functions for the module 137. For example, the control circuit 129 can provide control signals to one or more of the select switch 132A, the select switch 132B, or the antenna switch 136. Alternatively or additionally, the control circuit 129 can enable and/or disable the power amplifier 131 and/or the low noise amplifier 139.

Figure 14A:
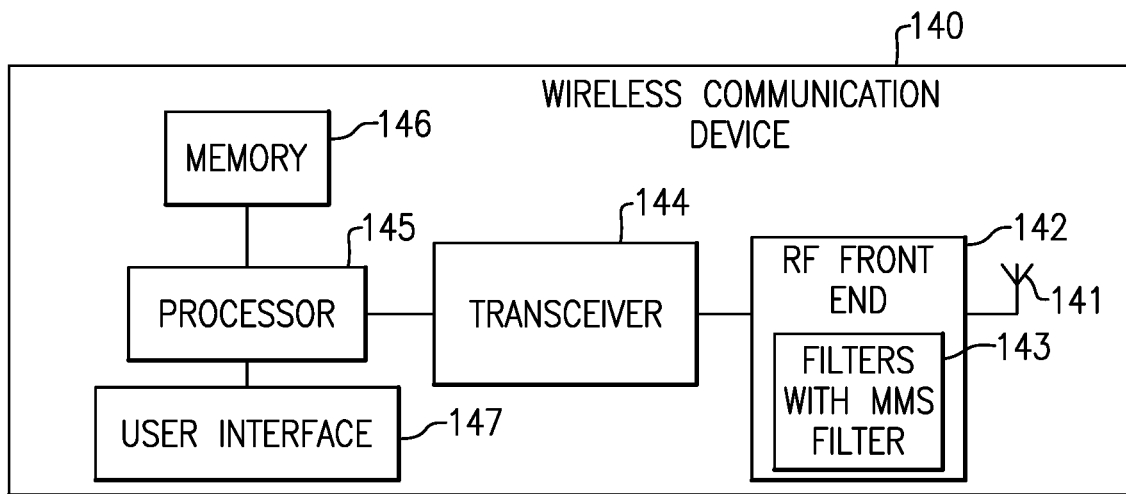
FIG. 14A is a schematic block diagram of a wireless communication device that includes an MMS filter in accordance with one or more embodiments.

FIG. 14A is a schematic diagram of a wireless communication device 140 that includes a MMS filter 143 in a radio frequency front end 142 according to an embodiment. The MMS filter 143 can be implemented in accordance with any suitable principles and advantages disclosed herein. The wireless communication device 140 can be any suitable wireless communication device. For instance, a wireless communication device 140 can be a mobile phone, such as a smart phone. As illustrated, the wireless communication device 140 includes an antenna 141, an RF front end 142, a transceiver 144, a processor 145, a memory 146, and a user interface 147. The antenna 141 can transmit RF signals provided by the RF front end 142. The antenna 141 can receive RF signals. The received RF signals can be provided to the RF front end 142.

The RF front end 142 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 142 can transmit and receive RF signals associated with any suitable communication standards. The MMS filter 143 can be arranged as a receive filter configured to filter an RF signal received via the antenna 141. The MMS filter 143 can include acoustic reflectors arranged to suppress a SH mode spurious in accordance with any principles and advantages disclosed herein.

The transceiver 144 can provide RF signals to the RF front end 142 for amplification and/or other processing. The transceiver 144 can also process an RF signal provided by a low noise amplifier of the RF front end 142. The transceiver 144 is in communication with the processor 145. The processor 145 can be a baseband processor. The processor 145 can provide any suitable base band processing functions for the wireless communication device 140. The memory 146 can be accessed by the processor 145. The memory 146 can store any suitable data for the wireless communication device 140. The user interface 147 can be any suitable user interface, such as a display with touch screen capabilities.

Figure 14B:
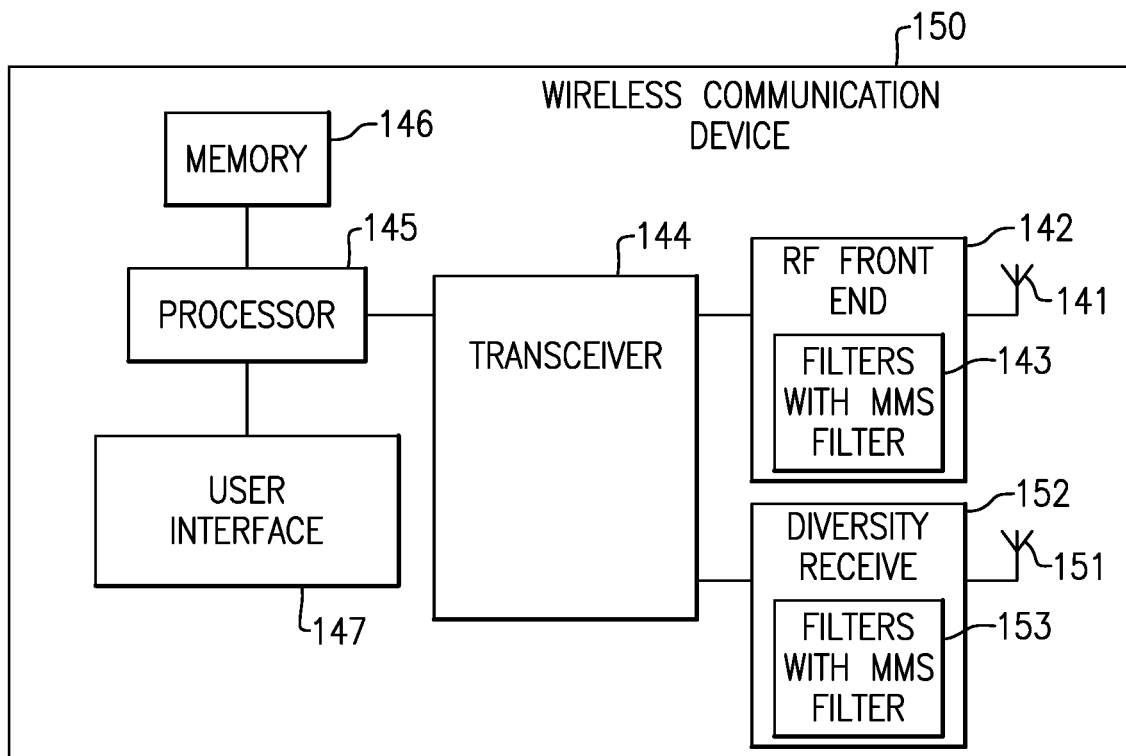
FIG. 14B is a schematic block diagram of another wireless communication device that includes an MMS filter in accordance with one or more embodiments.

FIG. 14B is a schematic diagram of a wireless communication device 150 that includes filters 143 in a radio frequency front end 142 and a second MMS filter 153 in a diversity receive module 152. The diversity receive module 152 can be considered part of a radio frequency front end that also include the radio frequency front end 142. The wireless communication device 150 is like the wireless communication device 140 of FIG. 14A, except that the wireless communication device 150 also includes diversity receive features. As illustrated in FIG. 14B, the wireless communication device 150 includes a diversity antenna 151, a diversity module 152 configured to process signals received by the diversity antenna 151 and including MMS filter 153, and a transceiver 154 in communication with both the radio frequency front end 142 and the diversity receive module 152. The MMS filter 153 can filter a radio frequency signal received via the diversity antenna 151. The MMS filter 153 can include acoustic reflectors arranged to suppress a SH mode spurious in accordance with any principles and advantages disclosed herein.

Any of the embodiments described above can be implemented in association with mobile devices such as cellular handsets. The principles and advantages of the embodiments can be used for any systems or apparatus, such as any uplink cellular device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals having a frequency in a range from about 30 kHz to 300 GHz, such as a frequency in a range from about 450 MHz to 8.5 GHz.

Aspects of this disclosure can be implemented in various electronic devices. Examples of the electronic devices can include, but are not limited to, consumer electronic products, parts of the consumer electronic products such as die and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A multi-mode surface acoustic wave filter comprising:
a plurality of interdigital transducer electrodes including a first interdigital transducer electrode and a second interdigital transducer electrode, the first interdigital transducer electrode being longitudinally coupled to the second interdigital transducer electrode, and the first interdigital transducer electrode including interdigital transducer electrode fingers having substantially uniform pitch; and
acoustic reflectors including a first acoustic reflector and a second acoustic reflector on opposing sides of the plurality of interdigital transducer electrodes, the second acoustic reflector being a mirrored version of the first acoustic reflector that is mirrored about an aperture direction, the first acoustic reflector including acoustic reflector fingers with slanted pitches and extending from a bus bar, the slanted pitches including three different spacings between different portions of adjacent acoustic reflector fingers of the first acoustic reflector, the three different spacings including a first spacing and a second spacing, the different portions of the adjacent acoustic reflector fingers each extending substantially perpendicular to the bus bar, the different portions of the adjacent acoustic reflector fingers including a first portion with the first spacing and second and third portions with the second spacing, the second and third portions being on opposing sides of the first portion, and the multi-mode surface acoustic wave filter is configured to filter a radio frequency signal.

2. The multi-mode surface acoustic wave filter of claim 1 wherein the first interdigital transducer electrode includes two metal layers.

3. The multi-mode surface acoustic wave filter of claim 1 wherein the acoustic reflector fingers have stepped lengths.

4. The multi-mode surface acoustic wave filter of claim 1 further comprising a temperature compensation layer and a piezoelectric layer, the temperature compensation layer being positioned over the plurality of interdigital transducer electrodes and the piezoelectric layer.

5. The multi-mode surface acoustic wave filter of claim 4 wherein the temperature compensation layer is a silicon dioxide layer.

6. The multi-mode surface acoustic wave filter of claim 1 further comprising a support substrate and a piezoelectric layer on the support substrate, the plurality of interdigital transducer electrodes being on and in physical contact with the piezoelectric layer.

7. The multi-mode surface acoustic wave filter of claim 2 further comprising a temperature compensation layer over the two metal layers, and a piezoelectric layer in physical contact with the first interdigital transducer electrode.

8. The multi-mode surface acoustic wave filter of claim 1 wherein the plurality of interdigital transducer electrodes include a third interdigital transducer electrode that is longitudinally coupled to the second interdigital transducer electrode.

9. A method of filtering a radio frequency signal with a multi-mode surface acoustic wave filter, the method comprising:
providing a radio frequency signal to the multi-mode surface acoustic wave filter;
filtering the radio frequency signal with the multi-mode surface acoustic wave filter, the multi-mode surface acoustic wave filter including a plurality of longitudinally coupled interdigital transducer electrodes and first and second acoustic reflectors on opposing sides of the plurality of longitudinally coupled interdigital transducer electrodes, the second acoustic reflector being a mirrored version of the first acoustic reflector that is mirrored about an aperture direction, a first interdigital transducer electrode of the longitudinally coupled interdigital transducer electrodes including interdigital transducer electrode fingers having substantially uniform pitch, the first acoustic reflector including acoustic reflector fingers with slanted pitches and extending from a bus bar, the slanted pitches including three different spacings between different portions of adjacent acoustic reflector fingers of the acoustic reflectors, the three different spacings including a first spacing and a second spacing, the different portions of the adjacent acoustic reflector fingers including a first portion with the first spacing and second and third portions with the second spacing, the second and third portions being on opposing sides of the first portion, and the different portions of the adjacent acoustic reflector fingers each extending substantially perpendicular to the bus bar; and
during the filtering, suppressing a spurious response due to shear horizontal mode of the multi-mode surface acoustic wave filter with the acoustic reflectors of the multi-mode surface acoustic wave filter.

10. The method of claim 9 further comprising providing temperature compensation during the filtering with a temperature compensation layer of the multi-mode surface acoustic wave filter, the temperature compensation layer being positioned over the plurality of longitudinally coupled interdigital transducer electrodes and a piezoelectric layer on which the plurality of interdigital transducer electrodes are positioned.

11. The method of claim 9 wherein the first interdigital transducer electrode includes two metal layers.

12. The method of claim 9 wherein the multi-mode surface acoustic wave filter further includes a support substrate and a piezoelectric layer over the support substrate, the plurality of longitudinally coupled interdigital transducer electrodes being over and in physical contact with the piezoelectric layer.

13. The method of claim 9 wherein the method is performed in a mobile wireless communication device.

14. The method of claim 9 wherein the multi-mode surface acoustic wave filter is included in a receive filter.

15. A packaged module comprising:
a multi-mode surface acoustic wave filter on a packaging substrate, the multi-mode surface acoustic wave filter configured to filter a radio frequency signal, the multi-mode surface acoustic wave filter including a plurality of longitudinally coupled interdigital transducer electrodes and first and second acoustic reflectors on opposing sides of the plurality of longitudinally coupled interdigital transducer electrodes, the second acoustic reflector being a mirrored version of the first acoustic reflector that is mirrored about an aperture direction, a first interdigital transducer electrode of the plurality of longitudinally coupled interdigital transducer electrodes including interdigital transducer electrode fingers having substantially uniform pitch, the first acoustic reflector including acoustic reflector fingers with slanted pitches and extending from a bus bar, the slanted pitches including three different spacings between different respective portions of adjacent acoustic reflector fingers of the acoustic reflector fingers, the three different spacings including a first spacing and a second spacing, the different respective portions of the adjacent acoustic reflector fingers including a first portion with the first spacing and second and third portions with the second spacing, the second and third portions being on opposing sides of the first portion, and the different portions of the adjacent acoustic reflector fingers each extending substantially perpendicular to the bus bar; and other circuitry on the packaging substrate and in communication with the multi-mode surface acoustic wave filter.

16. The packaged module of claim 15 wherein the other circuitry includes a radio frequency amplifier.

17. The packaged module of claim 15 wherein the other circuitry includes a radio frequency switch.

18. The packaged module of claim 15 wherein the multi-mode surface acoustic wave filter is included in a receive filter of a multiplexer.

19. The packaged module of claim 15 wherein the slanted pitches include three different spacings between three different respective portions of adjacent acoustic reflector fingers.

20. The packaged module of claim 15 wherein the multi-mode surface acoustic wave filter further includes a temperature compensation layer and a piezoelectric layer, the temperature compensation layer being positioned over the plurality of interdigital transducer electrodes and the piezoelectric layer.

* * * * *